(12) United States Patent
Philipp et al.

(10) Patent No.: US 8,017,930 B2
(45) Date of Patent: Sep. 13, 2011

(54) PILLAR PHASE CHANGE MEMORY CELL

(75) Inventors: Jan Boris Philipp, Peekskill, NY (US); Thomas Happ, Tarrytown, NY (US)

(73) Assignee: Qimonda AG, Munich (DE)

( * ) Notice: Subject to any disclaimer, the term of this patent is extended or adjusted under 35 U.S.C. 154(b) by 758 days.

(21) Appl. No.: 11/643,438

(22) Filed: Dec. 21, 2006

(65) Prior Publication Data

US 2008/0149909 A1    Jun. 26, 2008

(51) Int. Cl.
*H01L 47/00* (2006.01)
(52) U.S. Cl. ... 257/3; 257/2; 257/4; 257/5; 257/E45.002
(58) Field of Classification Search .................. 257/2–5, 257/E45.002
See application file for complete search history.

(56) References Cited

U.S. PATENT DOCUMENTS

| | | | |
|---|---|---|---|
| 6,674,115 B2 * | 1/2004 | Hudgens et al. ............ | 257/310 |
| 7,202,171 B2 * | 4/2007 | Trapp ........................... | 438/694 |
| 2005/0051901 A1 * | 3/2005 | Chen ............................ | 257/758 |
| 2006/0175599 A1 * | 8/2006 | Happ ............................ | 257/4 |
| 2007/0045606 A1 * | 3/2007 | Magistretti et al. ............ | 257/4 |
| 2007/0108430 A1 * | 5/2007 | Lung ............................ | 257/4 |

OTHER PUBLICATIONS

"A Novel Cell Technology Using N-doped GeSbTe Films for Phase Change RAM", H. Horii, et al., Samsung Electonrics Co., Ltd., (2 pgs.).
"Current Status of the Phase Change Memory and It's Future", Stefan Lai., Intel Corporation, 2002 (4 pgs.).
"Highly Reliable 50nm Contact Cell Technology for 256Mb PRAM", S. J. Ahn, et al., Samsung Electronics Co., Ltd (2 pgs.).
"High Scalable On-axis Confined Cell Structure for High Density PRAM beyond 256Mb", S. L. Cho, et al, Samsung Electronics Co., Ltd (2 pgs.).
"OUM—A 180 nm Nonvolatile Memory Cell Element Technology for Stand Along and Embedded Applications", Stefan Lai, et al, Intel Corporation, (4 pgs.).
"Scaling Analysis of Phase-Change Memory Technology", A. Pirovano, et al., STMicroelectronics, (3 pgs.).

* cited by examiner

*Primary Examiner* — Thien F Tran
(74) *Attorney, Agent, or Firm* — Dicke, Billig & Czaja, PLLC

(57) ABSTRACT

A memory cell includes a first electrode, a storage location, and a second electrode. The storage location includes a phase change material and contacts the first electrode. The storage location has a first cross-sectional width. The second electrode contacts the storage location and has a second cross-sectional width greater than the first cross-sectional width. The first electrode, the storage location, and the second electrode form a pillar phase change memory cell.

24 Claims, 21 Drawing Sheets

PILLAR PHASE CHANGE MEMORY CELL

BACKGROUND

One type of memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material for the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase change materials may be induced reversibly. In this way, the memory may change from the amorphous state to the crystalline state and from the crystalline state to the amorphous state in response to temperature changes. The temperature changes to the phase change material may be achieved in a variety of ways. For example, a laser can be directed to the phase change material, current may be driven through the phase change material, or current can be fed through a resistive heater adjacent the phase change material. In any of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

Typical fabrication of a phase change memory cell having a pillar cell structure involves an etching process. A pillar cell structure includes a bottom electrode, phase change material, and a top electrode. The thickness of the top electrode of the phase change memory cell may not be uniform, which contributes to uneven etching over the wafer. In addition, the etch rate for phase change material may be higher than the etch rate for the top electrode material. This difference in etch rates may result in the etch process being stopped too early or too late. If the etch process is stopped too early or too late, the pillar cell may not be uniform and may become structurally unstable.

For these and other reasons, there is a need for the present invention.

SUMMARY

One embodiment of the present invention provides a memory cell. The memory cell includes a first electrode, a storage location, and a second electrode. The storage location includes a phase change material and contacts the first electrode. The storage location has a first cross-sectional width. The second electrode contacts the storage location and has a second cross-sectional width greater than the first cross-sectional width. The first electrode, the storage location, and the second electrode form a pillar phase change memory cell.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
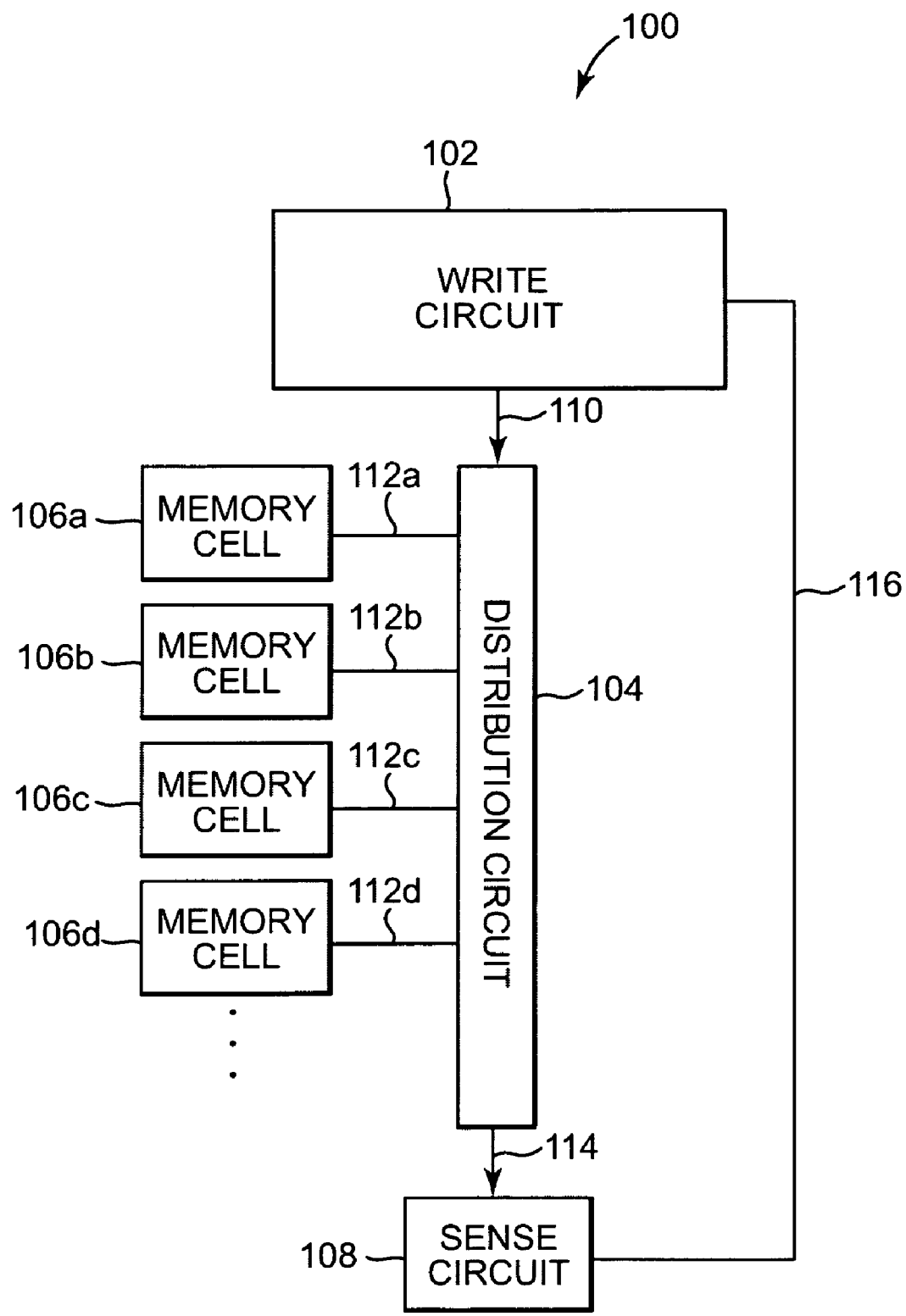
FIG. 1 is a block diagram illustrating one embodiment of a memory device.

FIG. 1 is a block diagram illustrating one embodiment of a memory device 100. Memory device 100 includes a write circuit 102, a distribution circuit 104, memory cells 106a, 106b, 106c, and 106d, and a sense circuit 108. Each of the memory cells 106a-106d is a phase change memory cell that stores data based on the amorphous and crystalline states of phase change material in the memory cell. Also, each of the memory cells 106a-106d can be programmed into one of two or more states by programming the phase change material to have intermediate resistance values. To program one of the memory cells 106a-106d to an intermediate resistance value, the amount of crystalline material coexisting with amorphous material—and hence the cell resistance—is controlled using a suitable write strategy.

As used herein, the term "electrically coupled" is not meant to mean that the elements must be directly coupled together and intervening elements may be provided between the "electrically coupled" elements.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d.

In addition, distribution circuit 104 is electrically coupled to sense circuit 108 through signal path 114, and sense circuit 108 is electrically coupled to write circuit 102 through signal path 116.

Each of the memory cells 106a-106d includes a phase change material that may be changed from an amorphous state to a crystalline state or from a crystalline state to an amorphous state under the influence of temperature change. The amount of crystalline phase change material coexisting with amorphous phase change material in one of the memory cells 106a-106d thereby defines two or more states for storing data within memory device 100.

Memory cells 106a-106d are pillar memory cells. In general, pillar memory cells include processing steps during fabrication in which phase change material is deposited and then etched to form free-standing portions of phase change material. In one embodiment of the present invention, the pillar memory cells are fabricated by forming a phase change material storage location contacting a first electrode and then forming a second electrode contacting the phase change material storage location. The phase change material storage location is fabricated by depositing a phase change material over an electrode, patterning the phase change material, and etching the phase change material to form the storage location. The storage location is then surrounded by dielectric material by depositing dielectric material over the phase change material and planarizing the dielectric material. The second electrode is then fabricated over the storage location using one or more deposition, patterning, and etching processes.

In the amorphous state, a phase change material exhibits significantly higher resistivity than in the crystalline state. Therefore, the two or more states of memory cells 106a-106d differ in their electrical resistivity. In one embodiment, the two or more states include two states and a binary system is used, wherein the two states are assigned bit values of "0" and "1". In another embodiment, the two or more states include three states and a trinary system is used, wherein the three states are assigned bit values of "0", "1", and "2". In another embodiment, the two or more states includes four states that are assigned multi-bit values, such as "00", "01", "10", and "11". In other embodiments, the two or more states can be any suitable number of states in the phase change material of a memory cell.

In one embodiment, write circuit 102 provides voltage pulses to distribution circuit 104 through signal path 110, and distribution circuit 104 controllably directs the voltage pulses to memory cells 106a-106d through signal paths 112a-112d. In one embodiment, distribution circuit 104 includes a plurality of transistors that controllably direct voltage pulses to each of the memory cells 106a-106d. In other embodiments, write circuit 102 provides current pulses to distribution circuit 104 through signal path 110, and distribution circuit 104 controllably directs the current pulses to memory cells 106a-106d through signal paths 112a-112d.

Sense circuit 108 reads each of the two or more states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d. In one embodiment, to read the resistance of one of the memory cells 106a-106d, sense circuit 108 provides current that flows through one of the memory cells 106a-106d and sense circuit 108 reads the voltage across that one of the memory cells 106a-106d. In one embodiment, sense circuit 108 provides voltage across one of the memory cells 106a-106d and reads the current that flows through that one of the memory cells 106a-106d. In one embodiment, write circuit 102 provides voltage across one of the memory cells 106a-106d and sense circuit 108 reads the current that flows through that one of the memory cells 106a-106d. In one embodiment, write circuit 102 provides current through one of the memory cells 106a-106d and sense circuit 108 reads the voltage across that one of the memory cells 106a-106d.

To program a memory cell 106a-106d within memory device 100, write circuit 102 generates a current or voltage pulse for heating the phase-change material in the target memory cell. In one embodiment, write circuit 102 generates an appropriate current or voltage pulse, which is fed into distribution circuit 104 and distributed to the appropriate target memory cell 106a-106d. The current or voltage pulse amplitude and duration is controlled depending on whether the memory cell is being set or reset. Generally, a "set" operation of a memory cell is heating the phase change material of the target memory cell above its crystallization temperature (but below its melting temperature) long enough to achieve the crystalline state or a partially crystalline and partially amorphous state. Generally, a "reset" operation of a memory cell is heating the phase change material of the target memory cell above its melting temperature, and then quickly quench cooling the material, thereby achieving the amorphous state or a partially amorphous and partially crystalline state.

Figure 2A:
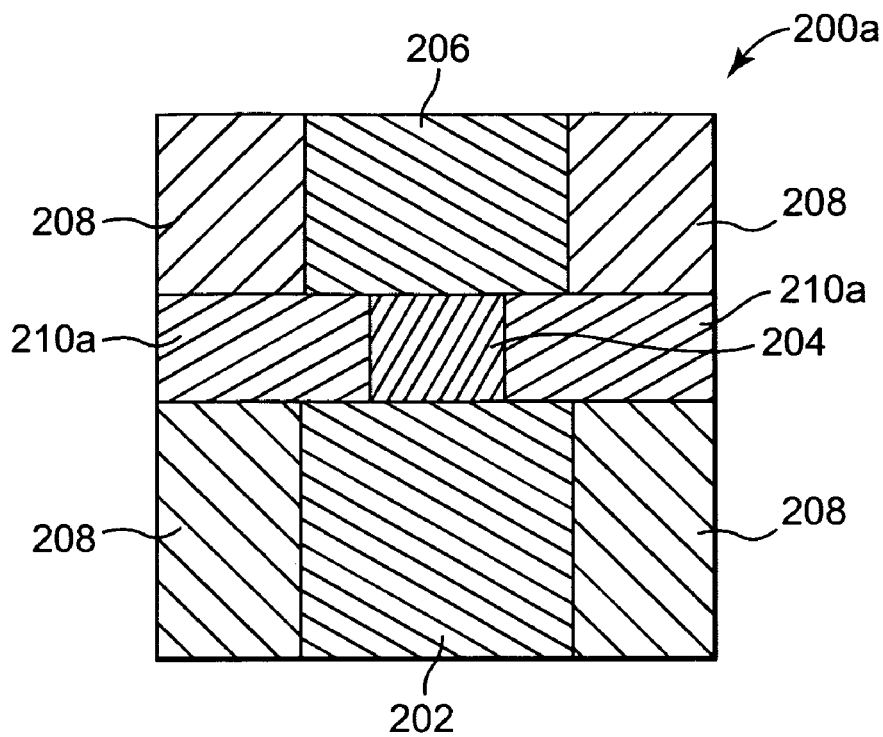
FIG. 2A illustrates a cross-sectional view of one embodiment of a phase change memory cell.

FIG. 2A illustrates a cross-sectional view of one embodiment of a phase change memory cell 200a. Phase change memory cell 200a includes a first electrode 202, phase change material 204, a second electrode 206, dielectric material 210a, and insulation material 208. Phase change material 204 provides a storage location for storing one or more bits of data. First electrode 202 contacts phase change material 204, and phase change material 204 contacts second electrode 206. In one embodiment, first electrode 202 and second electrode 206 have larger cross-sectional widths than phase change material 204. Dielectric material 210a laterally completely encloses phase change material 204. Insulation material 208 laterally completely encloses first electrode 202 and second electrode 206. In one embodiment, each of the memory cells 106a-106d is similar to phase change memory cell 200a.

Insulation material 208 can be any suitable insulator, such as $SiO_2$, $SiO_x$, SiN, fluorinated silica glass (FSG), boro-phosphorous silicate glass (BPSG), boro-silicate glass (BSG), or low-k material. Dielectric material 210a can be any suitable dielectric material, such as $SiO_2$, $SiO_x$, SiN, FSG, BPSG, BSG, or low-k material. In one embodiment, dielectric material 210a and insulation material 208 include the same material. In other embodiments, dielectric material 210a has a lower thermal conductivity than insulation material 208. First electrode 202 and second electrode 206 can be any suitable electrode material, such as TiN, TaN, W, Al, TiSiN, TiAlN, TaSiN, TaAlN, WN, or Cu.

Phase change material 204 may be made up of a variety of materials in accordance with the present invention. Generally, chalcogenide alloys that contain one or more elements from group VI of the periodic table are useful as such materials. In one embodiment, phase change material 204 of memory cell 200a is made up of a chalcogenide compound material, such as GeSbTe, SbTe, GeTe, or AgInSbTe. In another embodiment, phase change material 204 is chalcogen free, such as GeSb, GaSb, InSb, or GeGaInSb. In other embodiments, phase change material 204 is made up of any suitable material including one or more of the elements Ge, Sb, Te, Ga, As, In, Se, and S.

A selection device such as an active device like a transistor or diode, is coupled to first electrode 202 or second electrode 206 to control the application of current or voltage pulses to the other of first electrode 202 or second electrode 206, and thus to phase change material 204, to set and reset phase change material 204.

During operation of phase change memory cell 200a, current or voltage pulses are applied between first electrode 202 and second electrode 206 to program phase change memory cell 200a. During a set operation of phase change memory cell 200a, a set current or voltage pulse is selectively enabled to first electrode 202 and sent through phase change material 204 thereby heating it above its crystallization temperature (but usually below its melting temperature). In this way, phase change material 204 reaches a crystalline state or a partially crystalline and partially amorphous state during the set operation. During a reset operation of phase change memory cell 200a, a reset current or voltage pulse is selectively enabled to first electrode 202 and sent through phase change material 204. The reset current or voltage quickly heats phase change material 204 above its melting temperature. After the current or voltage pulse is turned off, phase change material 204 quickly quench cools into an amorphous state or a partially amorphous and partially crystalline state.

Figure 2B:
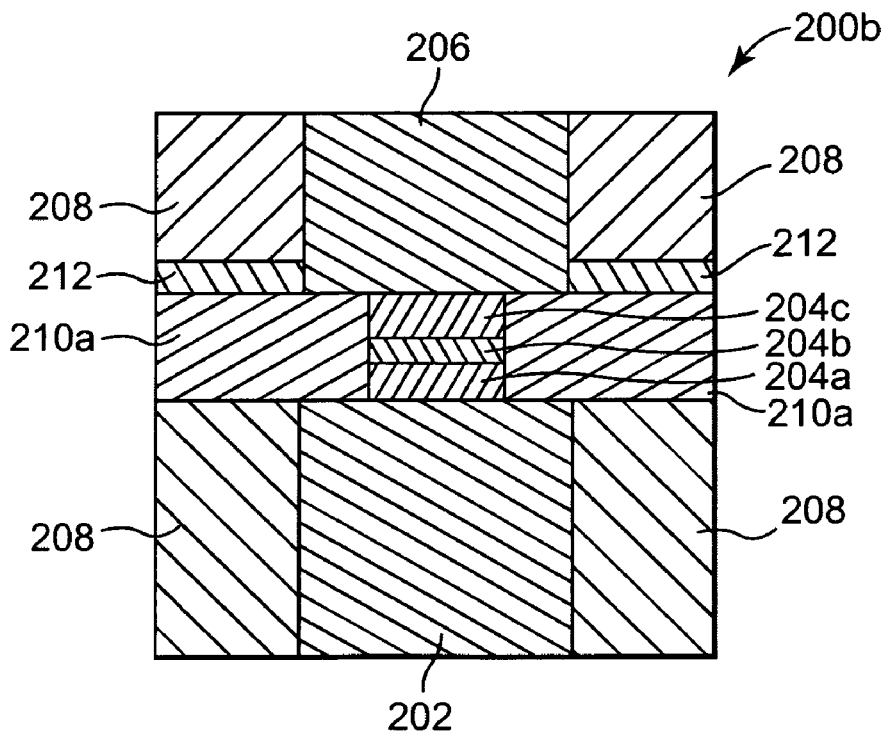
FIG. 2B illustrates a cross-sectional view of another embodiment of a phase change memory cell.

FIG. 2B illustrates a cross-sectional view of another embodiment of a phase change memory cell 200b. Phase change memory cell 200b is similar to phase change memory cell 200a previously described and illustrated with reference to FIG. 2A, except that phase change memory cell 200b includes etch stop material layer 212 and a phase change material layer stack 204a-204c. Etch stop material layer 212 is used during the fabrication process of phase change memory cell 200b to prevent over etching into phase change material 204 when fabricating second electrode 206. In one embodiment, each of the memory cells 106a-106d is similar to phase change memory cell 200b.

Phase change material layer stack 204a-204c includes two or more phase change material layers. At least two of the phase change materials layers 204a-204c include different phase change materials. In one embodiment, diffusion barrier layers, such as TiN, GeTe, or other suitable material, is deposited between adjacent phase change material layers 204a-204c, and/or between phase change material layer stack 204a-204c and first electrode 202, and/or between phase change material layer stack 204a-204c and second electrode 206. Phase change memory cell 200b operates similarly to phase change memory cell 200a.

The following FIGS. 3-12 illustrate embodiments of a method for fabricating a phase change memory cell, such as phase change memory cell 200a previously described and illustrated with reference to FIG. 2A and phase change memory cell 200b previously described and illustrated with reference to FIG. 2B.

Figure 3:
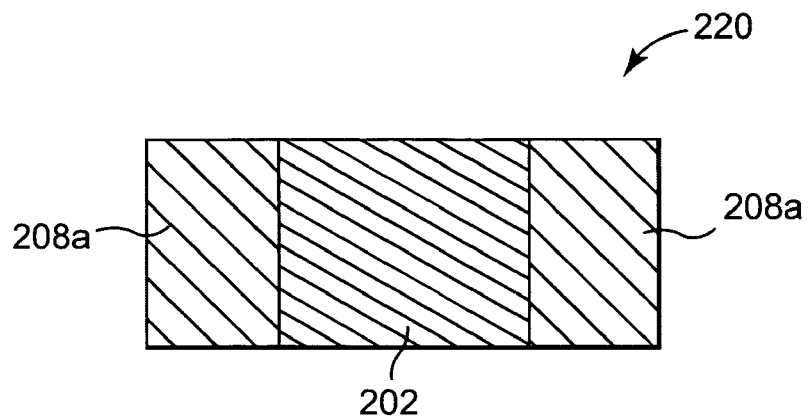
FIG. 3 illustrates a cross-sectional view of one embodiment of a preprocessed wafer.

FIG. 3 illustrates a cross-sectional view of one embodiment of a preprocessed wafer 220. Preprocessed wafer 220 includes first electrode 202, insulation material 208a, and lower wafer layers (not shown). In one embodiment, first electrode 202 is a contact plug, such as a tungsten plug, copper plug, TiN plug, TaN plug, Al plug, or other suitable conducting material plug. In another embodiment, first electrode 202 is a dedicated contact electrode comprising TiN, TaN, TiAlN, TiSiN, TaSiN, or TaAlN. First electrode 202 is laterally surrounded by insulation material 208a, such as $SiO_2$, $SiO_x$, SiN, FSG, BPSG, BSG, low-k material, or other suitable dielectric material, to electrically isolate first electrode 202 from adjacent device features.

Figure 4A:
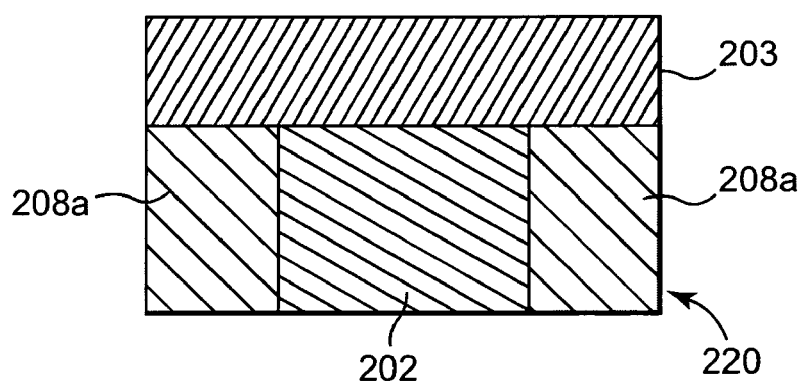
FIG. 4A illustrates a cross-sectional view of one embodiment of the preprocessed wafer and a phase change material layer.

FIG. 4A illustrates a cross-sectional view of one embodiment of preprocessed wafer 220 and a phase change material layer 203. A phase change material, such as a chalcogenide compound material or other suitable phase change material, is deposited over preprocessed wafer 220 to provide phase change material layer 203. Phase change material layer 203 is deposited using chemical vapor deposition (CVD), atomic layer deposition (ALD), metal organic chemical vapor deposition (MOCVD), plasma vapor deposition (PVD), jet vapor deposition (JVP), or other suitable deposition technique.

Figure 4B:
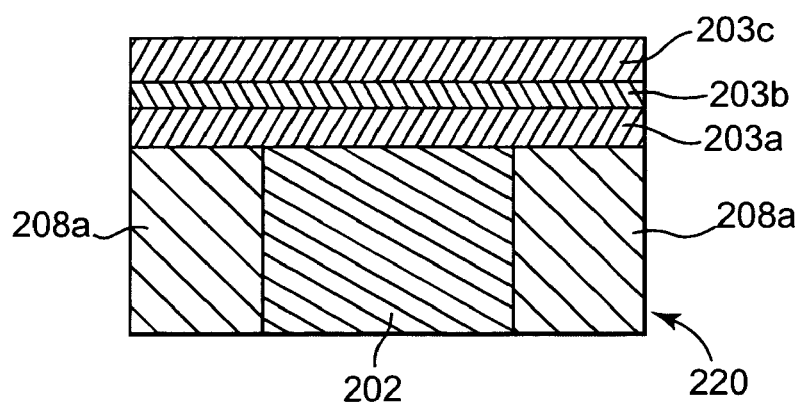
FIG. 4B illustrates a cross-sectional view of one embodiment of the preprocessed wafer and a stack of phase change material layers.

FIG. 4B illustrates a cross-sectional view of one embodiment of preprocessed wafer 220 and a stack of phase change material layers 203a-203c. In one embodiment, a stack of phase change material layers 203a-203c is used in place of the single phase change material layer 203 illustrated in FIG. 4A. A first phase change material, such as a chalcogenide compound material or other suitable phase change material, is deposited over preprocessed wafer 220 to provide first phase change material layer 203a. First phase change material layer 203a is deposited using CVD, ALD, MOCVD, PVD, JVP, or other suitable deposition technique.

A second phase change material, such as a chalcogenide compound material or other suitable phase change material, is deposited over first phase change material layer 203a to provide second phase change material layer 203b. Second phase change material layer 203b is deposited using CVD, ALD, MOCVD, PVD, JVP, or other suitable deposition technique.

A third phase change material, such as a chalcogenide compound material or other suitable phase change material, is deposited over second phase change material layer 203b to provide third phase change material layer 203c. Third phase change material layer 203c is deposited using CVD, ALD, MOCVD, PVD, JVP, or other suitable deposition technique. In other embodiments, another suitable number of phase change material layers are deposited on preprocessed wafer 220.

In one embodiment, diffusion barrier layers, such as TiN, GeTe, or other suitable material, is deposited between adjacent phase change material layers 203a-203c, and/or between phase change material layer stack 203a-203c and first electrode 202, and/or on top of phase change material layer stack 203a-203c. Although the remainder of the description describes the embodiments of the methods for fabricating the phase change memory cells using a single phase change material layer, the stack of phase change material layers 203a-203c can be used in place of the single phase change material layer 203 illustrated in FIG. 4A.

Figure 5:
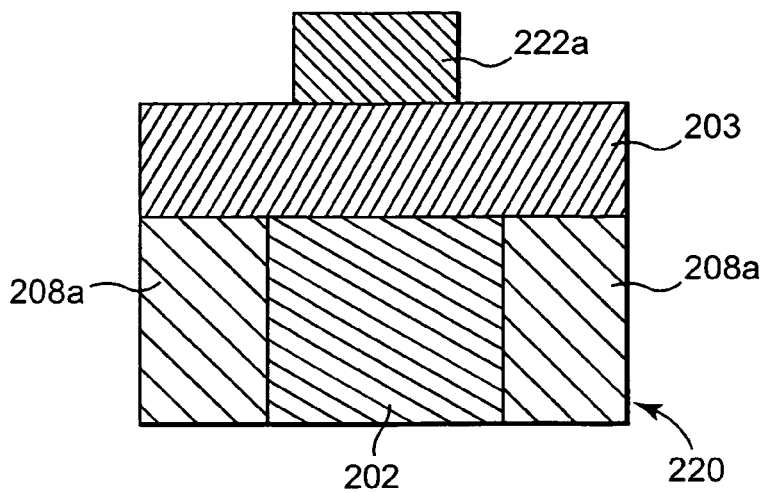
FIG. 5 illustrates a cross-sectional view of one embodiment of the preprocessed wafer, the phase change material layer, and a resist mask layer.

FIG. 5 illustrates a cross-sectional view of one embodiment of preprocessed wafer 220, phase change material layer 203, and a resist mask layer 222a. Resist material is deposited on phase change material layer 203 using spin on or another suitable technique. The resist material is patterned using photolithography or another suitable technique to provide resist mask layer 222a. In one embodiment, resist mask layer 222a is substantially centered over first electrode 202.

Figure 6:
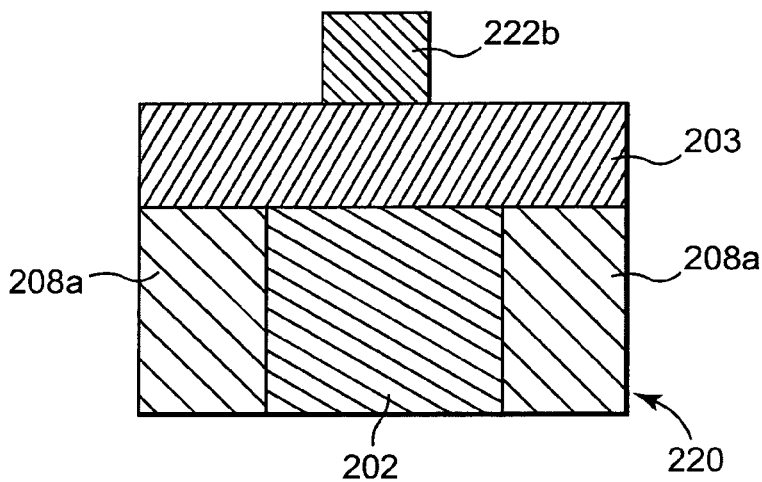
FIG. 6 illustrates a cross-sectional view of one embodiment of the preprocessed wafer, the phase change material layer, and the resist mask layer after a resist trim process.

FIG. 6 illustrates a cross-sectional view of one embodiment of preprocessed wafer 220, phase change material layer 203, and resist mask layer 222b after a resist trim process. Resist mask layer 222a is trimmed using a resist trim process to provide resist mask layer 222b having a smaller cross-sectional width than resist mask layer 222a. In one embodiment, the resist trim process provides resist mask layer 222b having a sublithographic cross-sectional width.

In another embodiment, instead of using a resist mask layer and a resist trim process as described and illustrated with reference to FIGS. 5 and 6, a hard mask process may be used. A hard mask material, such as $SiO_2$, $SiO_x$, SiN, FSG, BPSG, BSG, or other suitable hard mask material is deposited over phase change material layer 203 (FIG. 5) to provide a hard mask material layer. The hard mask material layer is deposited using CVD, ALD, MOCVD, PVD, JVP, or other suitable deposition technique.

Resist material is deposited over the hard mask material layer using spin on or another suitable technique. The resist material is patterned using photolithography or another suitable technique to provide a resist mask layer. In one embodiment, the resist mask layer is substantially centered over first electrode 202. The portions of the hard mask material layer that are not protected by the resist mask layer are etched to provide a hard mask. In one embodiment, the resist mask layer is trimmed as described with reference to FIG. 6 before the etch of the hard mask material layer.

In another embodiment, the hard mask material layer is trimmed after etching using a trim process to provide a hard mask having a smaller cross-sectional width. In one embodiment, the trim process provides a hard mask having a sublithographic cross-sectional width. In one embodiment, the resist mask layer is stripped after the hard mask trim. In another embodiment, the resist mask layer is stripped before the hard mask trim. In the following description, the hard mask may be used in place of resist mask layer 222b.

Figure 7:
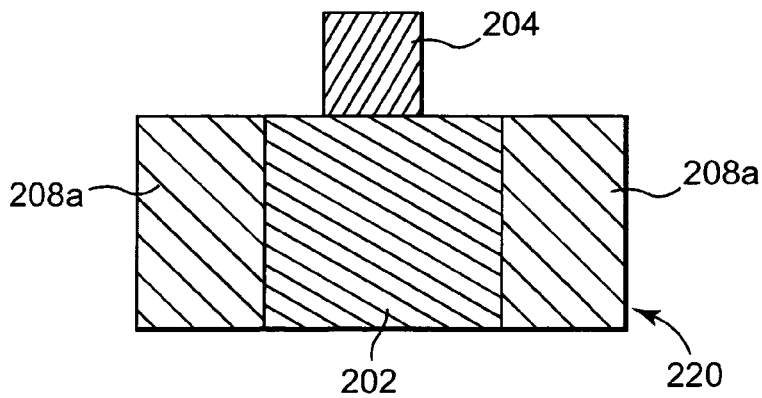
FIG. 7 illustrates a cross-sectional view of one embodiment of the preprocessed wafer and a storage location after etching the phase change material layer.

FIG. 7 illustrates a cross-sectional view of one embodiment of preprocessed wafer 220 and a storage location 204 after etching phase change material layer 203. The portions of phase change material layer 203 not protected by resist mask layer 222b are etched to expose preprocessed wafer 220 and provide phase change material storage location 204. Resist mask layer 222b is then removed.

Figure 8:
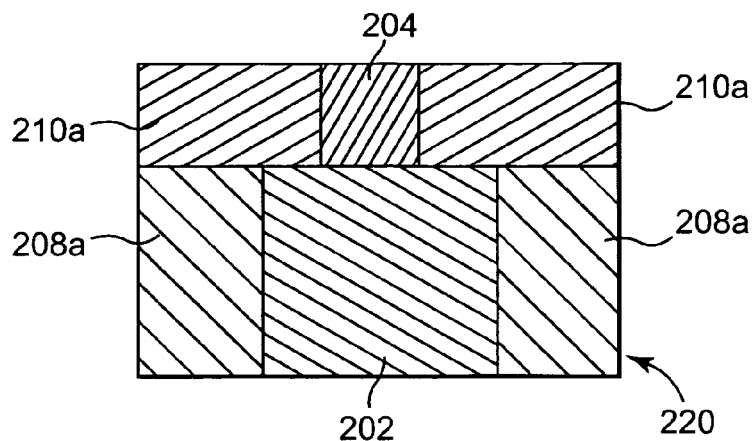
FIG. 8 illustrates a cross-sectional view of one embodiment of the preprocessed wafer, the storage location, and a dielectric material layer.

FIG. 8 illustrates a cross-sectional view of one embodiment of preprocessed wafer 220, storage location 204, and a dielectric material layer 210a. Dielectric material, such as $SiO_2$, $SiO_x$, SiN, FSG, BPSG, BSG, low-k material, or other suitable dielectric material is deposited over exposed portions of preprocessed wafer 220 and storage location 204. The dielectric material is deposited using CVD, ALD, MOCVD, PVD, JVP, or other suitable deposition technique. The dielectric material is planarized using chemical mechanical planarization (CMP) or another suitable planarization technique to expose storage location 204 and provide dielectric material layer 210a. In one embodiment, dielectric material layer 210a and insulation material 208a include the same material. In another embodiment, dielectric material layer 210a has a lower thermal conductivity than insulation material 208a.

Figure 9A:
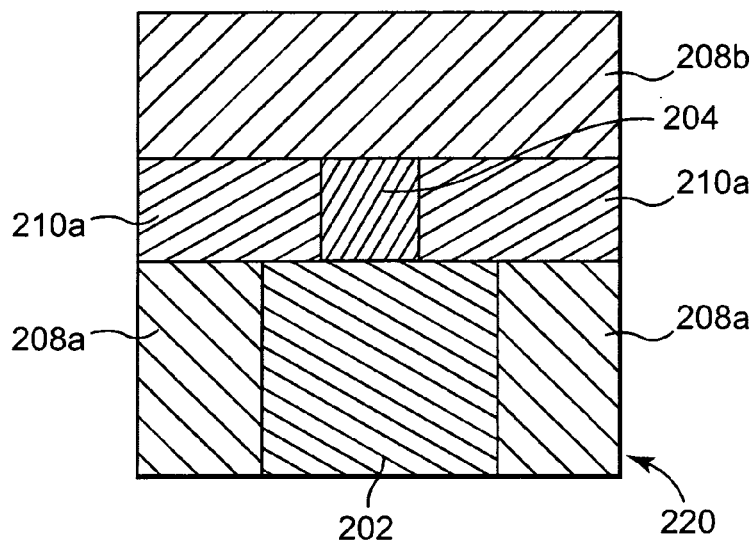
FIG. 9A illustrates a cross-sectional view of one embodiment of the preprocessed wafer, the storage location, the dielectric material layer, and an insulation material layer.

FIG. 9A illustrates a cross-sectional view of one embodiment of preprocessed wafer 220, storage location 204, dielectric material layer 210a, and an insulation material layer 208b. Insulation material, such as $SiO_2$, $SiO_x$, SiN, FSG, BPSG, BSG, low-k material, or other suitable dielectric material is deposited over exposed portions of dielectric material layer 210a and storage location 204 to provide insulation material layer 208b. Insulation material layer 208b is deposited using CVD, ALD, MOCVD, PVD, JVP, or other suitable deposition technique.

Figure 9B:
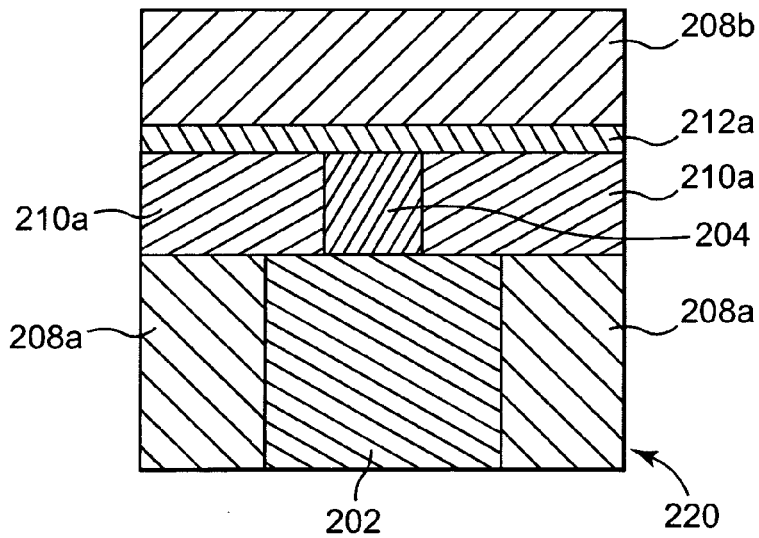
FIG. 9B illustrates a cross-sectional view of one embodiment of the preprocessed wafer, the storage location, the dielectric material layer, an etch stop material layer, and an insulation material layer.

FIG. 9B illustrates a cross-sectional view of one embodiment of preprocessed wafer 220, storage location 204, dielectric material layer 210a, an etch stop material layer 212a, and an insulation material layer 208b. In one embodiment, an etch stop material layer 212a and an insulation material layer 208b are used in place of insulation material layer 208b illustrated in FIG. 9A. An etch stop material layer, such as SiN or another suitable etch stop material, is deposited over exposed portions of dielectric material layer 210a and storage location 204 to provide etch stop material layer 212a. Etch stop material layer 212a is deposited using CVD, ALD, MOCVD, PVD, JVP, or other suitable deposition technique.

Insulation material, such as $SiO_2$, $SiO_x$, SiN, FSG, BPSG, BSG, low-k material, or other suitable dielectric material is deposited over etch stop material layer 212a to provide insulation material layer 208b. Insulation material layer 208b is deposited using CVD, ALD, MOCVD, PVD, JVP, or other suitable deposition technique. Although the remainder of the description describes the embodiments of the methods for fabricating the phase change memory cells without using etch stop material layer 212a below insulation material layer 208b, etch stop material layer 212a and insulation material layer 208b illustrated in FIG. 9B can be used in place of insulation material layer 208b illustrated in FIG. 9A.

Figure 10:
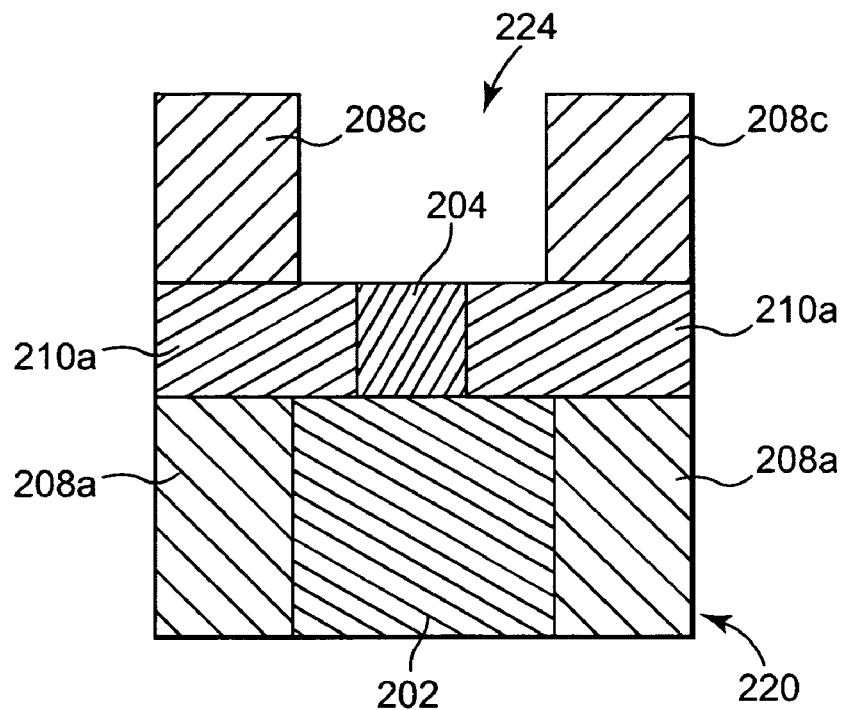
FIG. 10 illustrates a cross-sectional view of one embodiment of the preprocessed wafer, the storage location, the dielectric material layer, and the insulation material layer after etching an opening in the insulation material layer.

FIG. 10 illustrates a cross-sectional view of one embodiment of preprocessed wafer 220, storage location 204, dielectric material layer 210a, and insulation material layer 208c after etching an opening 224 in insulation material layer 208b. Insulation material layer 208c is etched to expose storage location 204 and provide opening 224. In one embodiment, opening 224 is substantially centered over storage location 204.

Electrode material, such as TiN, TaN, W, Al, TiSiN, TiAlN, TaSiN, TaAlN, WN, Cu, or other suitable electrode material, is deposited over exposed portions of insulation material layer 208c, dielectric material layer 210a, and storage location 204. The electrode material layer is deposited using CVD, ALD, MOCVD, PVD, JVP, or other suitable deposition technique. The electrode material layer is planarized using CMP or another suitable planarization technique to expose insulation material layer 208c and form second electrode 206. This process provides phase change memory cell 200a as illustrated in FIG. 2A or phase change memory cell 200b as illustrated in FIG. 2B.

Figure 11:
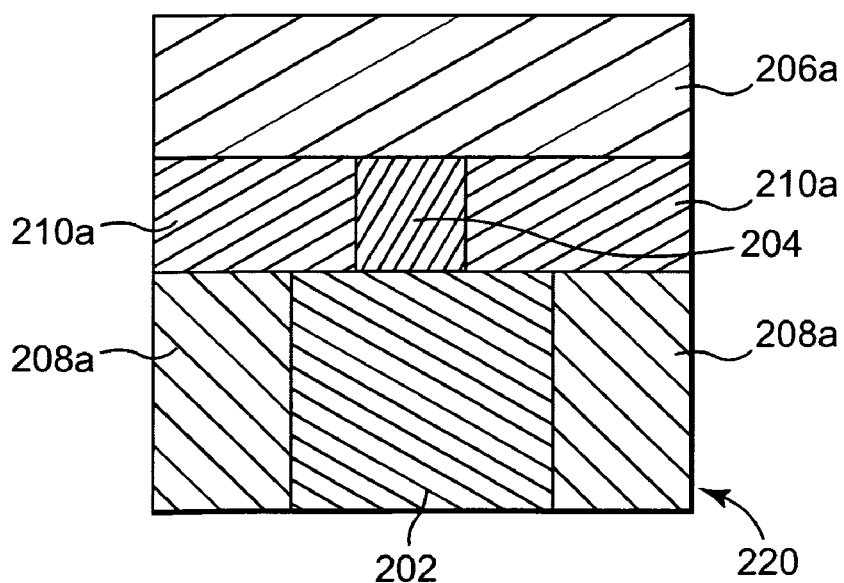
FIG. 11 illustrates a cross-sectional view of one embodiment of the preprocessed wafer, the storage location, the dielectric material layer, and an electrode material layer.
Figure 12:
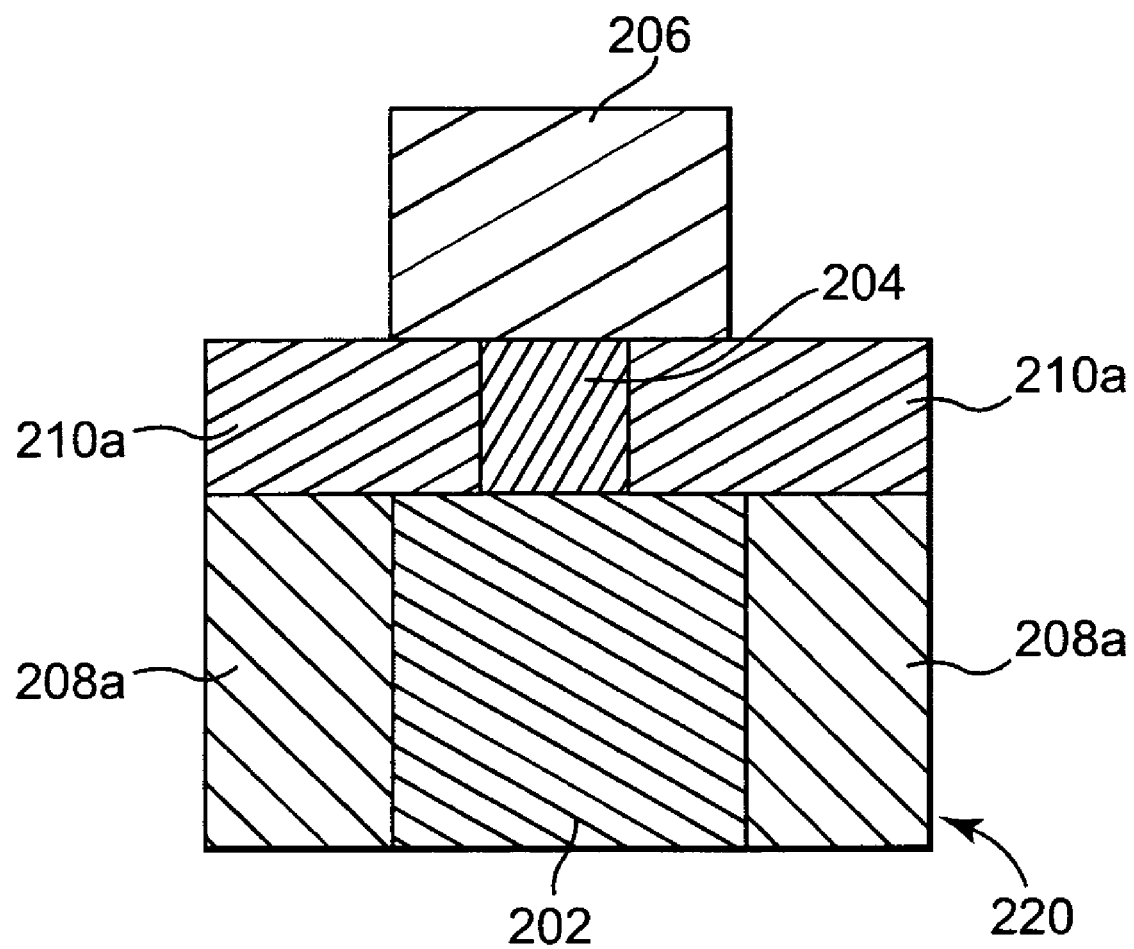
FIG. 12 illustrates a cross-sectional view of one embodiment of the preprocessed wafer, the storage location, the dielectric material layer, and a second electrode after etching the electrode material layer.

The following FIGS. 11 and 12 illustrate another embodiment for fabricating second electrode 206 that can be used in place of the process described with reference to FIGS. 9A-10.

FIG. 11 illustrates a cross-sectional view of one embodiment of preprocessed wafer 220, storage location 204, dielectric material layer 210a, and an electrode material layer 206a. Electrode material, such as TiN, TaN, W, Al, TiSiN, TiAlN, TaSiN, TaAlN, WN, Cu, or other suitable electrode material, is deposited over exposed portions of dielectric material layer 210a and storage location 204 to provide electrode material layer 206a. Electrode material layer 206a is deposited using CVD, ALD, MOCVD, PVD, JVP, or other suitable deposition technique.

FIG. 12 illustrates a cross-sectional view of one embodiment of preprocessed wafer 220, storage location 204, dielectric material layer 210a, and second electrode 206 after etching electrode material layer 206a. Electrode material layer 206a is etched to expose dielectric material layer 210a and provide second electrode 206. In one embodiment, second electrode 206 is substantially centered over storage location 204.

Insulation material, such as $SiO_2$, $SiO_x$, SiN, FSG, BPSG, BSG, low-k material, or other suitable dielectric material is deposited over exposed portions of second electrode 206 and dielectric material layer 210a. The insulation material is deposited using CVD, ALD, MOCVD, PVD, JVP, or other suitable deposition technique. The insulation material is planarized using CMP or another suitable planarization technique to expose second electrode 206 and provide phase change memory cell 200a as illustrated in FIG. 2A or phase change memory cell 200b as illustrated in FIG. 2B.

Figure 13A:
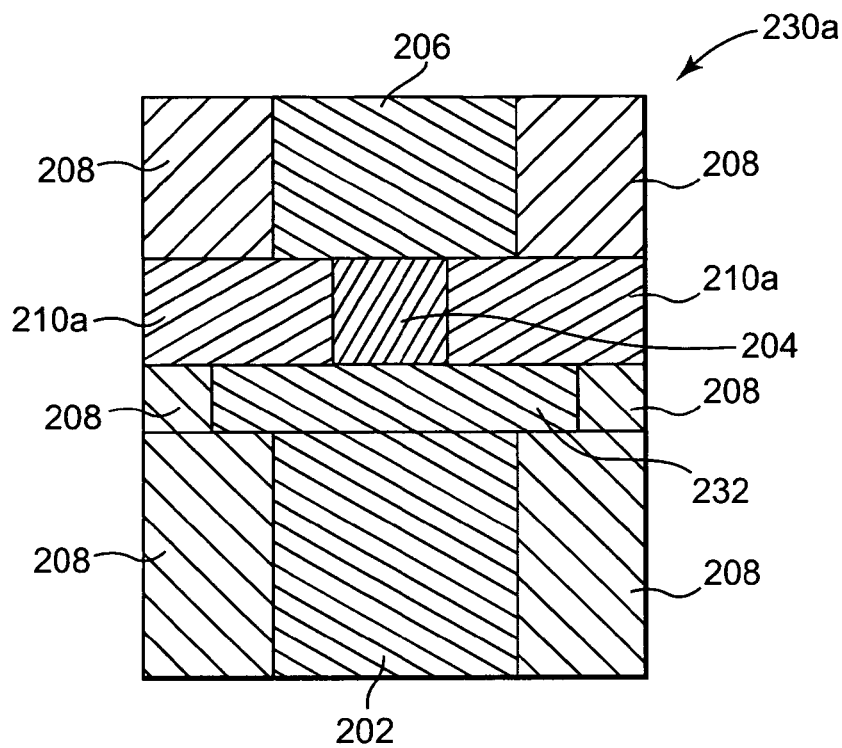
FIG. 13A illustrates a cross-sectional view of another embodiment of a phase change memory cell.

FIG. 13A illustrates a cross-sectional view of another embodiment of a phase change memory cell 230a. Phase change memory cell 230a is similar to phase change memory cell 200a previously described and illustrated with reference to FIG. 2A, except that phase change memory cell 230a includes a bottom contact or electrode 232. Bottom contact 232 contacts first electrode 202 and phase change material 204. Bottom contact 232 is laterally completely surrounded by insulation material 208. Bottom contact 232 includes any suitable electrode material, such as TiN, TaN, W, Al, TiSiN, TiAlN, TaSiN, TaAlN, WN, or Cu. In one embodiment, each of the memory cells 106a-106d is similar to phase change memory cell 230a. Phase change memory cell 230a operates similarly to phase change memory cell 200a.

Figure 13B:
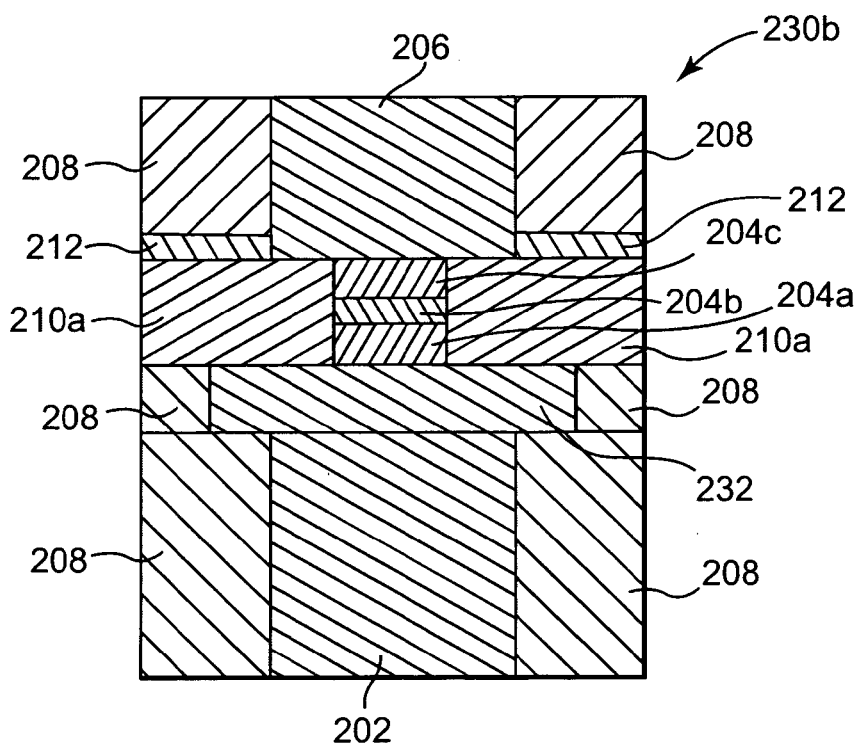
FIG. 13B illustrates a cross-sectional view of another embodiment of a phase change memory cell.

FIG. 13B illustrates a cross-sectional view of another embodiment of a phase change memory cell 230b. Phase change memory cell 230b is similar to phase change memory cell 230a previously described and illustrated with reference to FIG. 13A, except that phase change memory cell 230b includes etch stop material layer 212 and phase change material layer stack 204a-204c as previously described with reference to phase change memory cell 200b illustrated in FIG. 2B. In one embodiment, each of the memory cells 106a-106d is similar to phase change memory cell 230b. Phase change memory cell 230b operates similarly to phase change memory cell 200a.

The following FIGS. 14-19 illustrate embodiments of a method for fabricating a phase change memory cell, such as phase change memory cell 230a previously described and illustrated with reference to FIG. 13A and phase change memory cell 230b previously described and illustrated with reference to FIG. 13B. The fabrication process begins with a preprocessed wafer 220 as previously described and illustrated with reference to FIG. 3.

Figure 14:
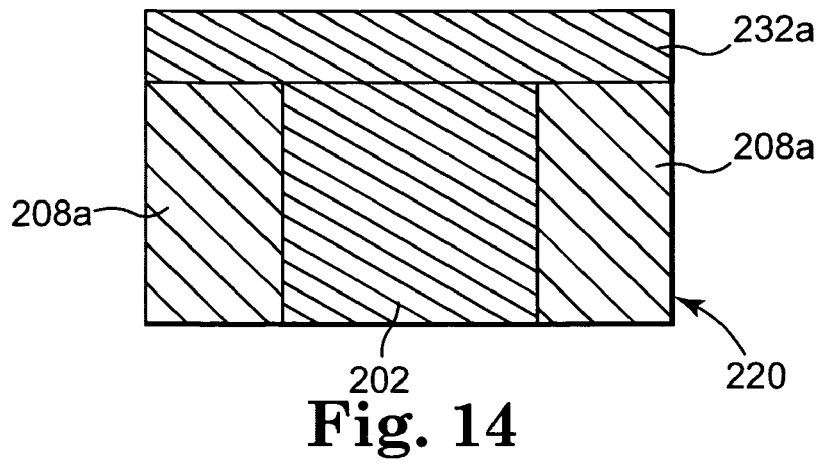
FIG. 14 illustrates a cross-sectional view of one embodiment of the preprocessed wafer and a contact material layer.

FIG. 14 illustrates a cross-sectional view of one embodiment of preprocessed wafer 220 and a contact material layer 232a. Electrode material, such as TiN, TaN, W, Al, TiSiN, TiAlN, TaSiN, TaAlN, WN, Cu, or other suitable electrode material, is deposited over preprocessed wafer 220 to provide contact material layer 232a. Contact material layer 232a is deposited using CVD, ALD, MOCVD, PVD, JVP, or other suitable deposition technique.

Figure 15:
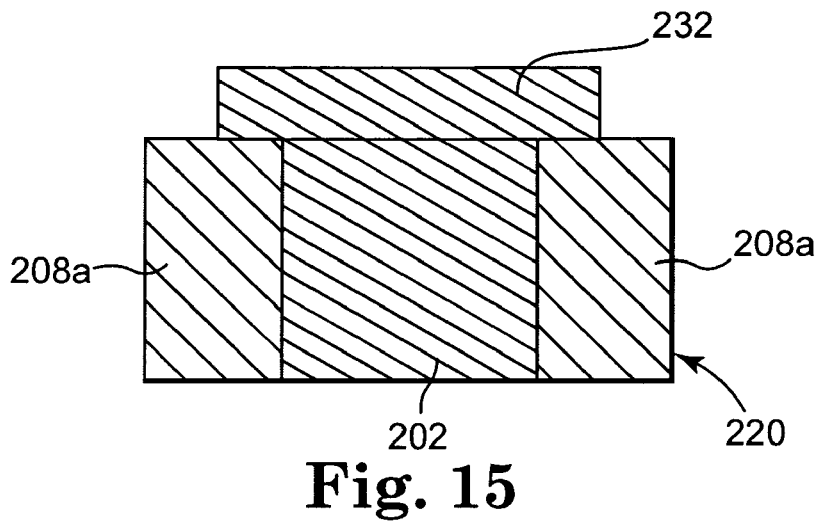
FIG. 15 illustrates a cross-sectional view of one embodiment of the preprocessed wafer and a bottom contact after etching the contact material layer.

FIG. 15 illustrates a cross-sectional view of one embodiment of preprocessed wafer 220 and a bottom contact 232 after etching contact material layer 232a. Contact material layer 232a is etched to expose preprocessed wafer 220 and provide bottom contact 232. In one embodiment, bottom contact 232 is substantially centered over first electrode 202. In one embodiment, bottom contact 232 completely covers the top of first electrode 202. In other embodiments, bottom contact 232 partially covers the top of first electrode 202.

Figure 16:
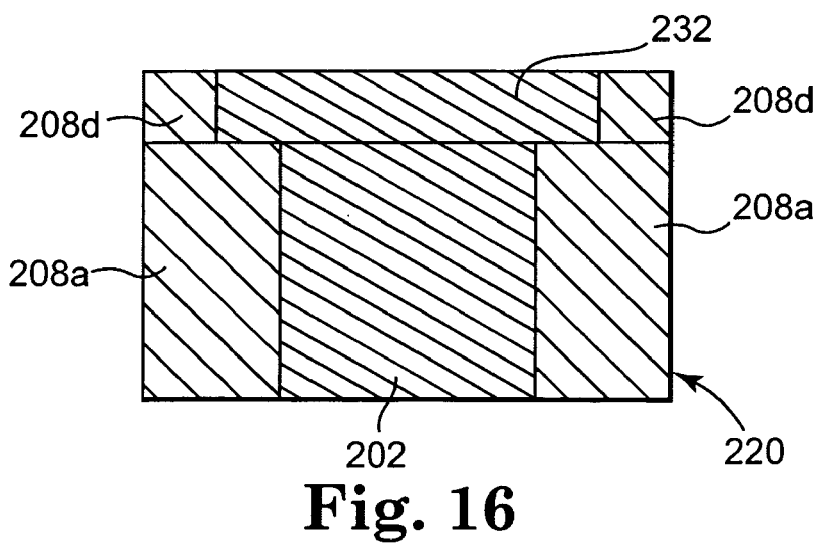
FIG. 16 illustrates a cross-sectional view of one embodiment of the preprocessed wafer, the bottom contact, and an insulation material.

FIG. 16 illustrates a cross-sectional view of one embodiment of preprocessed wafer 220, bottom contact 232, and an insulation material layer 208d. Insulation material, such as $SiO_2$, $SiO_x$, SiN, FSG, BPSG, BSG, low-k material, or other suitable dielectric material is deposited over exposed portions of preprocessed wafer 220 and bottom contact 232. The insulation material is deposited using CVD, ALD, MOCVD, PVD, JVP, or other suitable deposition technique. The insulation material is planarized using CMP or another suitable planarization technique to expose bottom contact 232 and provide insulation material layer 208d.

Figure 17:
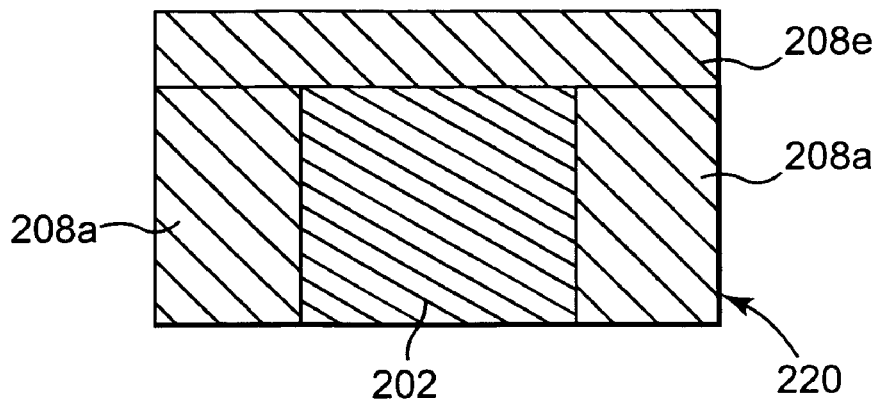
FIG. 17 illustrates a cross-sectional view of one embodiment of the preprocessed wafer and an insulation material layer.
Figure 18:
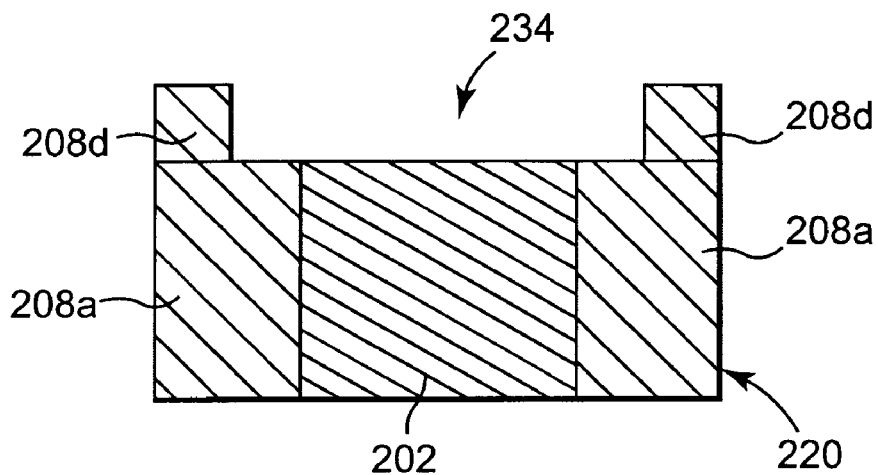
FIG. 18 illustrates a cross-sectional view of one embodiment of the preprocessed wafer and insulation material after etching the insulation material layer.
Figure 19:
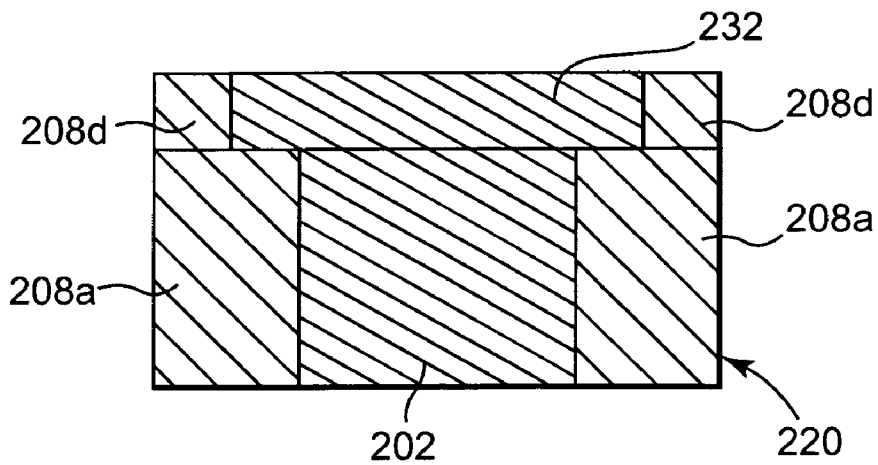
FIG. 19 illustrates a cross-sectional view of one embodiment of the preprocessed wafer, the insulation material, and a bottom contact.

The following FIGS. 17-19 illustrate another embodiment of a process for fabricating bottom contact 232 that can be used in place of the process described and illustrated with reference to FIGS. 14-16.

FIG. 17 illustrates a cross-sectional view of one embodiment of preprocessed wafer 220 and an insulation material layer 208e. Insulation material, such as $SiO_2$, $SiO_x$, SiN, FSG, BPSG, BSG, low-k material, or other suitable dielectric material is deposited over preprocessed wafer 220 to provide insulation material layer 208e. Insulation material layer 208e is deposited using CVD, ALD, MOCVD, PVD, JVP, or other suitable deposition technique.

FIG. 18 illustrates a cross-sectional view of one embodiment of preprocessed wafer 220 and insulation material 208d after etching an opening 234 in insulation material layer 208e. Insulation material layer 208e is etched to expose first electrode 202 and provide opening 234. In one embodiment, opening 234 is substantially centered over first electrode 202. In one embodiment, opening 234 completely exposes the top of first electrode 202. In other embodiments, opening 234 partially exposes the top of first electrode 202.

FIG. 19 illustrates a cross-sectional view of one embodiment of preprocessed wafer 220, insulation material 208d, and bottom contact 232. Electrode material, such as TiN, TaN, W, Al, TiSiN, TiAlN, TaSiN, TaAlN, WN, Cu, or other suitable electrode material, is deposited over exposed portions of insulation material layer 208d and preprocessed wafer 220. The electrode material layer is deposited using CVD, ALD, MOCVD, PVD, JVP, or other suitable deposition technique. The electrode material layer is planarized using CMP or another suitable planarization technique to expose insulation material layer 208d and form bottom contact 232. The process previously described with reference to FIGS. 4A-12 is then performed using preprocessed wafer 220 and bottom contact 232 to fabricate phase change memory cell 230a illustrated in FIG. 13A or phase change memory cell 230b illustrated in FIG. 13B.

Figure 20A:
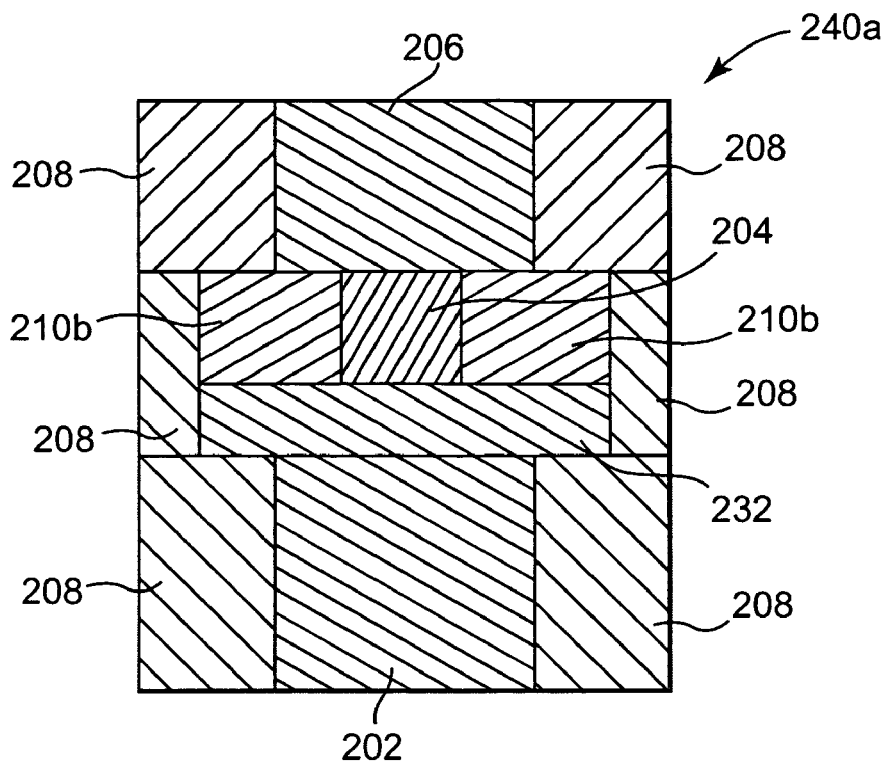
FIG. 20A illustrates a cross-sectional view of another embodiment of a phase change memory cell.

FIG. 20A illustrates a cross-sectional view of another embodiment of a phase change memory cell 240a. Phase change memory cell 240a is similar to phase change memory cell 230a previously described and illustrated with reference to FIG. 13A, except that in phase change memory cell 240a, dielectric material layer 210a is replaced with dielectric material layer 210b, which is laterally surrounded by insulation material 208. In one embodiment, each of the memory cells 106a-106d is similar to phase change memory cell 240a. Phase change memory cell 240a operates similarly to phase change memory cell 200a.

Figure 20B:
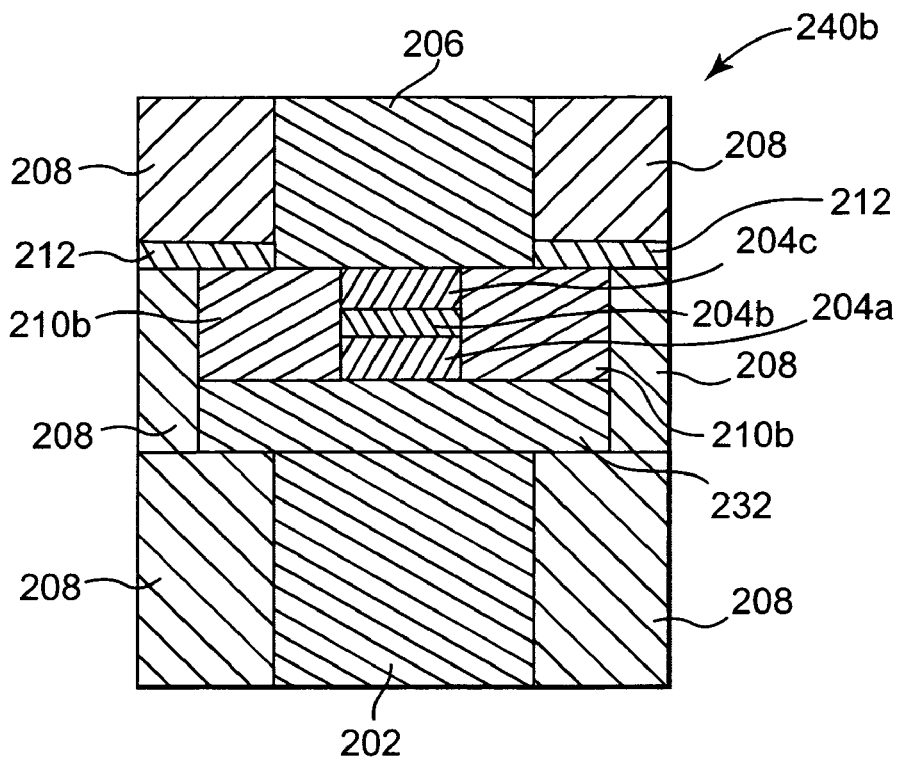
FIG. 20B illustrates a cross-sectional view of another embodiment of a phase change memory cell.

FIG. 20B illustrates a cross-sectional view of another embodiment of a phase change memory cell 240b. Phase change memory cell 240b is similar to phase change memory cell 240a previously described and illustrated with reference to FIG. 20A, except that phase change memory cell 240b includes etch stop material layer 212 and phase change material layer stack 204a-204c as previously described with reference to phase change memory cell 200b illustrated in FIG. 2B. In one embodiment, each of the memory cells 106a-106d is similar to phase change memory cell 240b. Phase change memory cell 240b operates similarly to phase change memory cell 200a.

The following FIGS. 21-28 illustrate embodiments of a method for fabricating a phase change memory cell, such as phase change memory cell 240a previously described and illustrated with reference to FIG. 20A and phase change memory cell 240b previously described and illustrated with reference to FIG. 20B.

Figure 21:
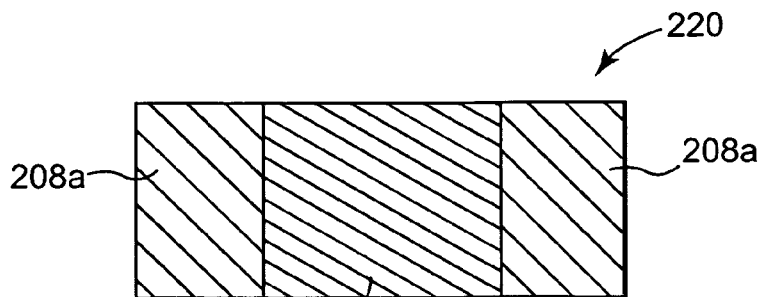
FIG. 21 illustrates a cross-sectional view of one embodiment of a preprocessed wafer.

FIG. 21 illustrates a cross-sectional view of one embodiment of preprocessed wafer 220. Preprocessed wafer 220 includes first electrode 202, insulation material 208a, and lower wafer layers (not shown). In one embodiment, first electrode 202 is a contact plug, such as a tungsten plug, copper plug, TiN plug, TaN plug, Al plug, or other suitable conducting material plug. In another embodiment, first electrode 202 is a dedicated contact electrode comprising TiN, TaN, TiAlN, TiSiN, TaSiN, or TaAlN. First electrode 202 is laterally surrounded by insulation material 208a, such as $SiO_2$, $SiO_x$, SiN, FSG, BPSG, BSG, low-k material, or other suitable dielectric material, to electrically isolate first electrode 202 from adjacent device features.

Figure 22:
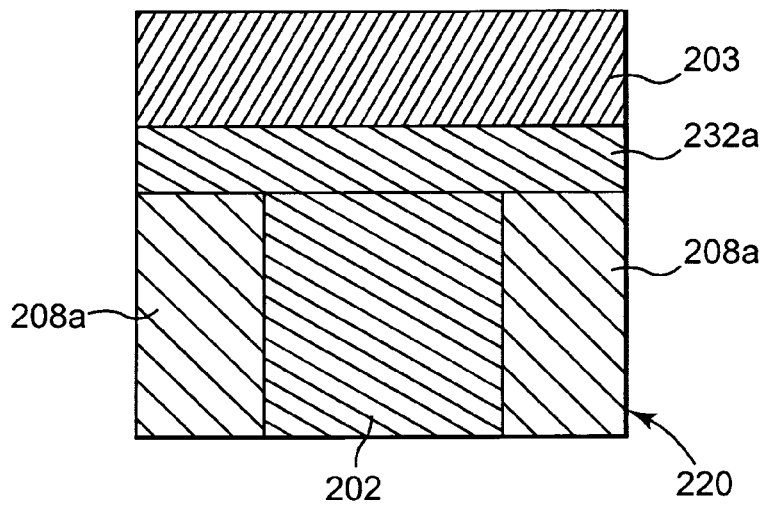
FIG. 22 illustrates a cross-sectional view of one embodiment of the preprocessed wafer, a contact material layer, and a phase change material layer.

FIG. 22 illustrates a cross-sectional view of one embodiment of preprocessed wafer 220, a contact material layer 232a, and a phase change material layer 203. Electrode material, such as TiN, TaN, W, Al, TiSiN, TiAlN, TaSiN, TaAlN, WN, Cu, or other suitable electrode material, is deposited over preprocessed wafer 220 to provide contact material layer 232a. Contact material layer 232a is deposited using CVD, ALD, MOCVD, PVD, JVP, or other suitable deposition technique.

A phase change material, such as a chalcogenide compound material or other suitable phase change material, is deposited over contact material layer 232a to provide phase change material layer 203. Phase change material layer 203 is deposited using CVD, ALD, MOCVD, PVD, JVP, or other suitable deposition technique.

Figure 23:
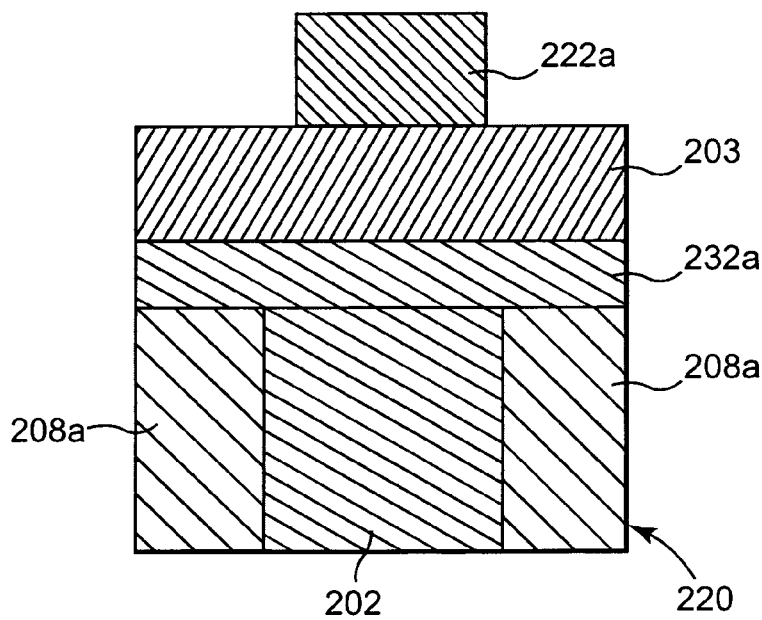
FIG. 23 illustrates a cross-sectional view of one embodiment of the preprocessed wafer, the contact material layer, the phase change material layer, and a resist mask layer.

FIG. 23 illustrates a cross-sectional view of one embodiment of preprocessed wafer 220, contact material layer 232a, phase change material layer 203, and a resist mask layer 222a. Resist material is deposited on phase change material layer 203 using spin on or another suitable technique. The resist material is patterned using photolithography or another suitable technique to provide resist mask layer 222a. In one embodiment, resist mask layer 222a is substantially centered over first electrode 202.

Figure 24:
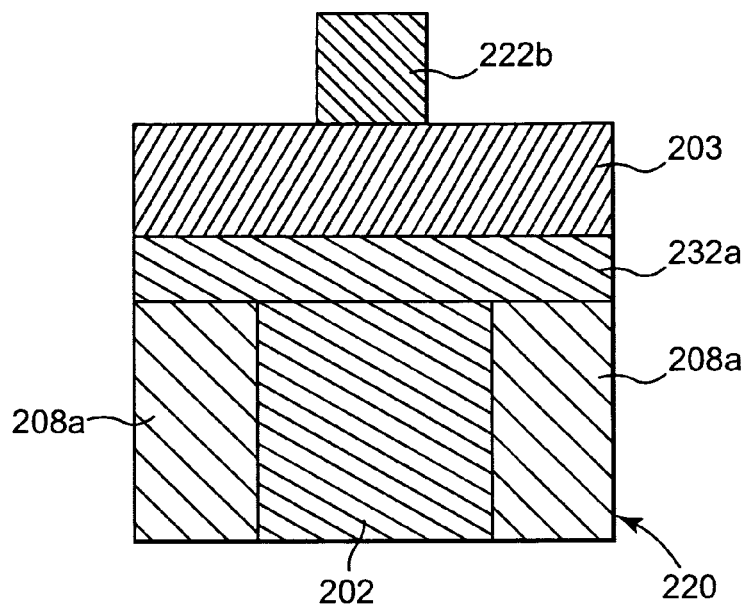
FIG. 24 illustrates a cross-sectional view of one embodiment of the preprocessed wafer, the contact material layer, the phase change material layer, and the resist mask layer after a resist trim process.

FIG. 24 illustrates a cross-sectional view of one embodiment of preprocessed wafer 220, contact material layer 232a, phase change material layer 203, and resist mask layer 222b after a resist trim process. Resist mask layer 222a is trimmed using a resist trim process to provide resist mask layer 222b having a smaller cross-sectional width than resist mask layer 222a. In one embodiment, the resist trim process provides resist mask layer 222b having a sublithographic cross-sectional width.

In another embodiment, instead of using a resist mask layer and a resist trim process as described and illustrated with reference to FIGS. 23 and 24, a hard mask process may be used. A hard mask material, such as $SiO_2$, $SiO_x$, SiN, FSG, BPSG, BSG, or other suitable hard mask material is deposited over phase change material layer 203 (FIG. 23) to provide a hard mask material layer. The hard mask material layer is deposited using CVD, ALD, MOCVD, PVD, JVP, or other suitable deposition technique.

Resist material is deposited over the hard mask material layer using spin on or another suitable technique. The resist material is patterned using photolithography or another suitable technique to provide a resist mask layer. In one embodiment, the resist mask layer is substantially centered over first electrode 202. The portions of the hard mask material layer that are not protected by the resist mask layer are etched to provide a hard mask. In one embodiment, the resist mask layer is trimmed as described with reference to FIG. 24 before the etch of the hard mask material layer.

In another embodiment, the hard mask material layer is trimmed after etching using a trim process to provide a hard mask having a smaller cross-sectional width. In one embodiment, the trim process provides a hard mask having a sublithographic cross-sectional width. In one embodiment, the resist mask layer is stripped after the hard mask trim. In another embodiment, the resist mask layer is stripped before the hard mask trim. In the following description, the hard mask may be used in place of resist mask layer 222b.

Figure 25:
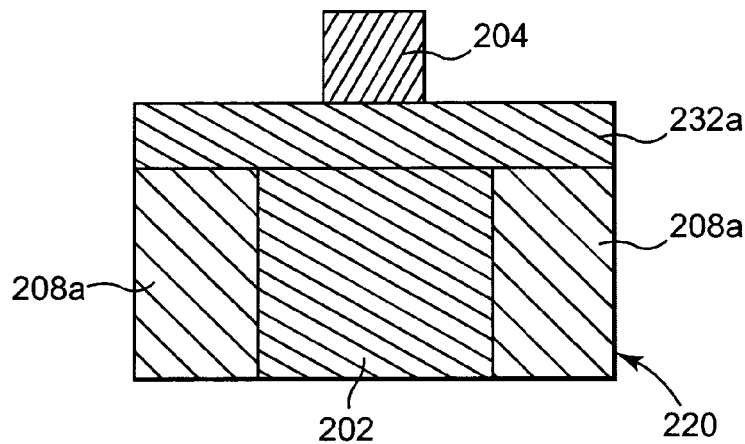
FIG. 25 illustrates a cross-sectional view of one embodiment of the preprocessed wafer, the contact material layer, and a storage location after etching the phase change material layer.

FIG. 25 illustrates a cross-sectional view of one embodiment of preprocessed wafer 220, contact material layer 232a, and a storage location 204 after etching phase change material layer 203. The portions of phase change material layer 203 not protected by resist mask layer 222b are etched to expose contact material layer 232a and provide phase change material storage location 204. Resist mask layer 222b is then removed.

Figure 26:
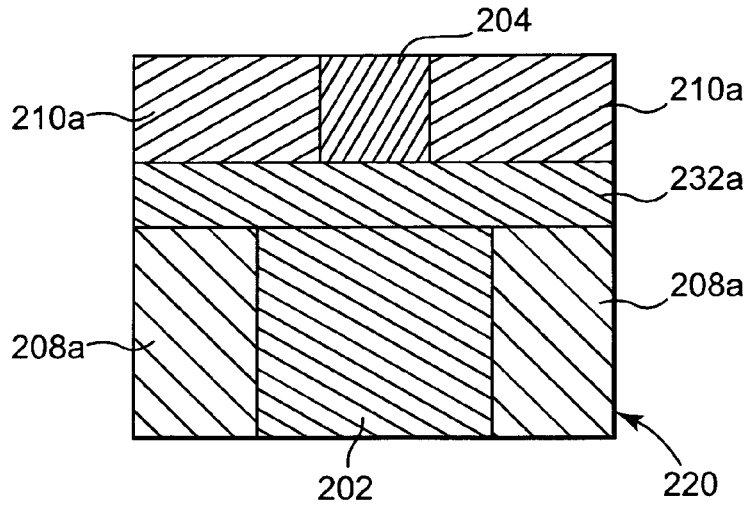
FIG. 26 illustrates a cross-sectional view of one embodiment of the preprocessed wafer, the contact material layer, the storage location, and a dielectric material layer.

FIG. 26 illustrates a cross-sectional view of one embodiment of preprocessed wafer 220, contact material layer 232a, storage location 204, and a dielectric material layer 210a. Dielectric material, such as $SiO_2$, $SiO_x$, SiN, FSG, BPSG, BSG, low-k material, or other suitable dielectric material is deposited over exposed portions of preprocessed wafer 220 and storage location 204. The dielectric material is deposited using CVD, ALD, MOCVD, PVD, JVP, or other suitable deposition technique. The dielectric material is planarized using CMP or another suitable planarization technique to expose storage location 204 and provide dielectric material layer 210a. In one embodiment, dielectric material 210a and insulation material 208a include the same material. In another embodiment, dielectric material 210a has a lower thermal conductivity than insulation material 208a.

Figure 27:
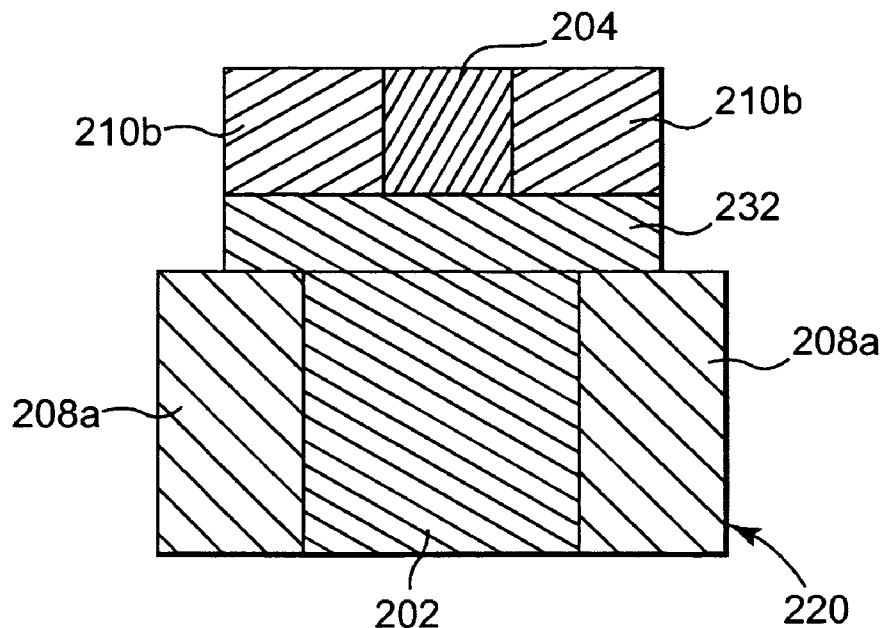
FIG. 27 illustrates a cross-sectional view of one embodiment of the preprocessed wafer, a bottom contact, the storage location, and dielectric material after etching the dielectric material layer and the contact material layer.

FIG. 27 illustrates a cross-sectional view of one embodiment of preprocessed wafer 220, a bottom contact 232, storage location 204, and dielectric material 210b after etching dielectric material layer 210a and contact material layer 232a. Dielectric material layer 210a and contact material layer 232a are etched to expose preprocessed wafer 220 and provide dielectric material layer 210b and bottom contact 232.

Figure 28:
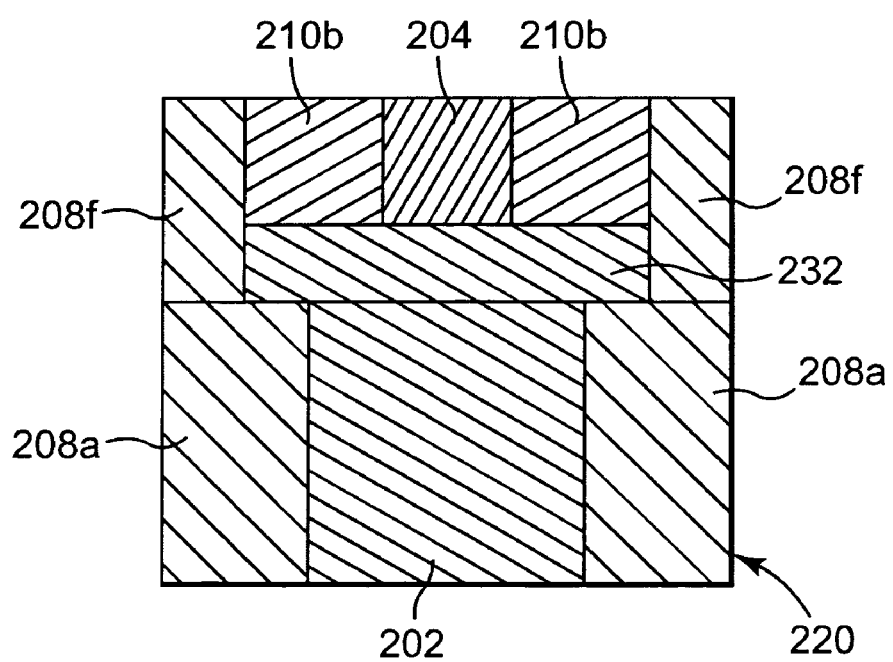
FIG. 28 illustrates a cross-sectional view of one embodiment of the preprocessed wafer, the bottom contact, the storage location, the dielectric material and insulation material.

FIG. 28 illustrates a cross-sectional view of one embodiment of preprocessed wafer 220, bottom contact 232, storage location 204, dielectric material 210b, and insulation material 208f. Insulation material, such as $SiO_2$, $SiO_x$, SiN, FSG, BPSG, BSG, low-k material, or other suitable dielectric material is deposited over exposed portions of preprocessed wafer 220, bottom contact 232, dielectric material layer 210b, and storage location 204. The insulation material is deposited using CVD, ALD, MOCVD, PVD, JVP, or other suitable deposition technique. The insulation material is planarized using CMP or another suitable planarization technique to expose storage location 204 and dielectric material layer 210b and to provide insulation material layer 208f. The process previously described with reference to FIGS. 9A-12 is then performed to fabricate second electrode 206 of phase change memory cell 240a as illustrated in FIG. 20A or phase change memory cell 240b as illustrated in FIG. 20B.

Figure 29A:
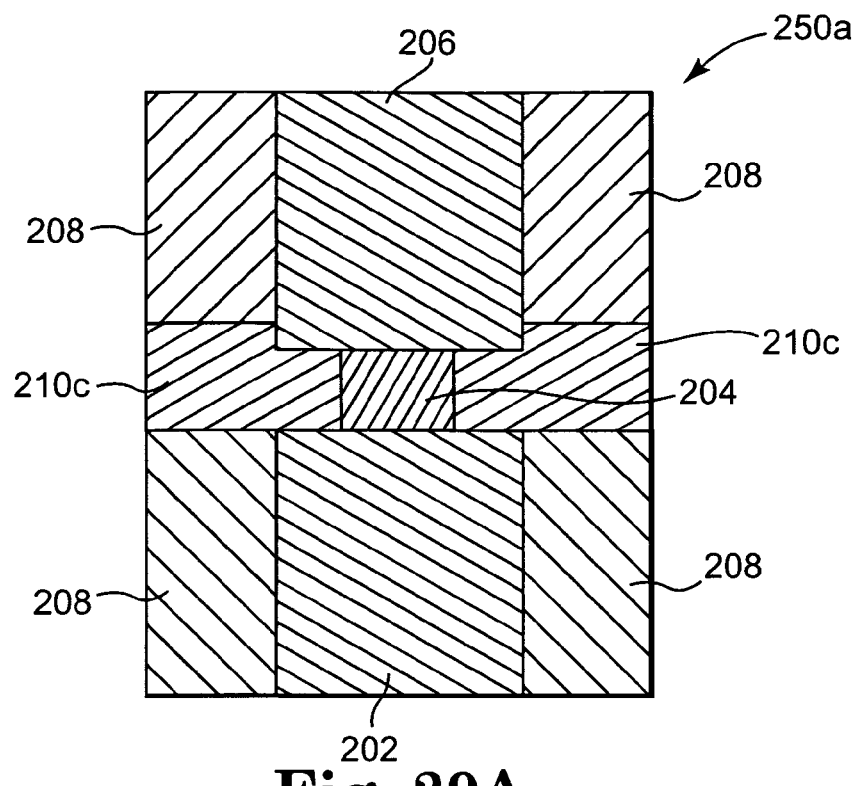
FIG. 29A illustrates a cross-sectional view of another embodiment of a phase change memory cell.

FIG. 29A illustrates a cross-sectional view of another embodiment of a phase change memory cell 250a. Phase change memory cell 250a is similar to phase change memory cell 200a previously described and illustrated with reference to FIG. 2A, except that in phase change memory cell 250a dielectric material layer 210a is replaced with dielectric material layer 210c. Dielectric material layer 210c surrounds phase change material 204 and surrounds the bottom portion of second electrode 206. In one embodiment, each of the memory cells 106a-106d is similar to phase change memory cell 250a. Phase change memory cell 250a operates similarly to phase change memory cell 200a.

Figure 29B:
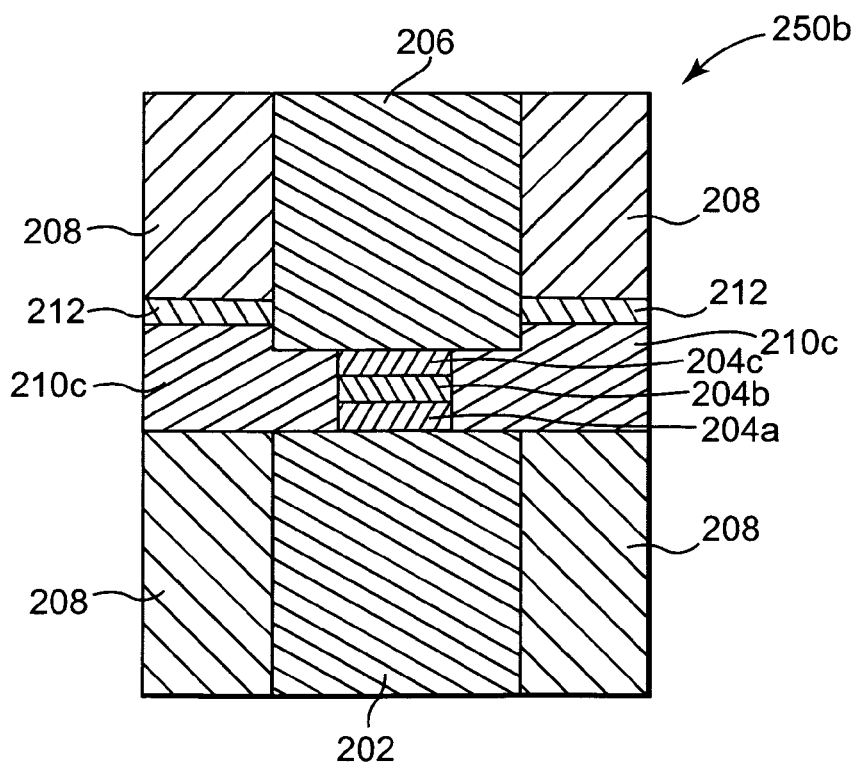
FIG. 29B illustrates a cross-sectional view of another embodiment of a phase change memory cell.

FIG. 29B illustrates a cross-sectional view of another embodiment of a phase change memory cell 250b. Phase change memory cell 250b is similar to phase change memory cell 250a previously described and illustrated with reference to FIG. 29A, except that phase change memory cell 250b includes etch stop material layer 212 and phase change material layer stack 204a-204c as previously described with reference to phase change memory cell 200b illustrated in FIG. 2B. In one embodiment, each of the memory cells 106a-106d is similar to phase change memory cell 250b. Phase change memory cell 250b operates similarly to phase change memory cell 200a.

Figure 30:
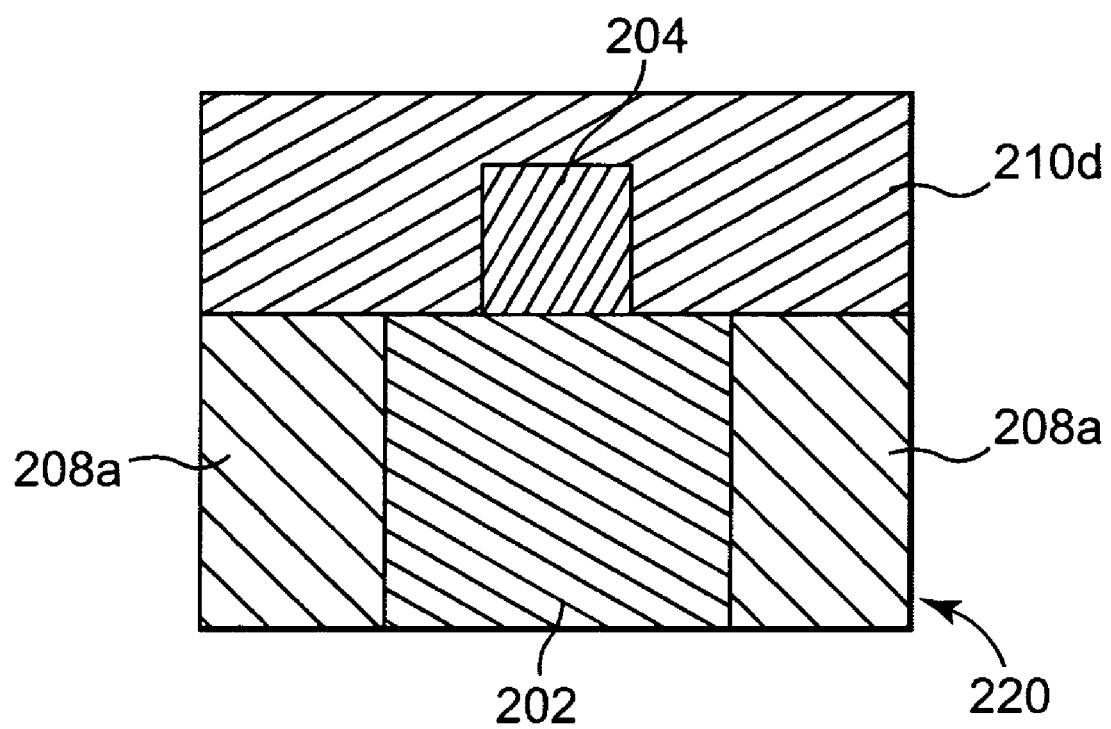
FIG. 30 illustrates a cross-sectional view of one embodiment of the preprocessed wafer, the storage location, and a dielectric material layer.

The following FIG. 30 illustrates embodiments of a method for fabricating a phase change memory cell, such as phase change memory cell 250a previously described and illustrated with reference to FIG. 29A and phase change memory cell 250b previously described and illustrated with reference to FIG. 29B. The fabrication process begins by performing the steps previously described and illustrated with reference to FIGS. 3-7.

FIG. 30 illustrates a cross-sectional view of one embodiment of preprocessed wafer 220, storage location 204, and a dielectric material layer 210d. Dielectric material, such as $SiO_2$, $SiO_x$, SiN, FSG, BPSG, BSG, low-k material, or other suitable dielectric material is deposited over exposed portions of preprocessed wafer 220 and storage location 204. The dielectric material is deposited using CVD, ALD, MOCVD, PVD, JVP, or other suitable deposition technique. The dielectric material is planarized using CMP or another suitable planarization technique without exposing storage location 204 to provide dielectric material layer 210d.

Storage location 204 is protected from the planarization by the portion of dielectric material layer 210d capping storage location 204. In one embodiment, dielectric material 210d and insulation material 208a include the same material. In another embodiment, dielectric material 210d has a lower thermal conductivity than insulation material 208a. The process previously described with reference to FIGS. 9A-10 is then performed to fabricate second electrode 206, except that dielectric material layer 210d is also etched to provide opening 224 illustrated in FIG. 10. This process is used to fabricate phase change memory cell 250a as illustrated in FIG. 29A or phase change memory cell 250b as illustrated in FIG. 29B.

Figure 31A:
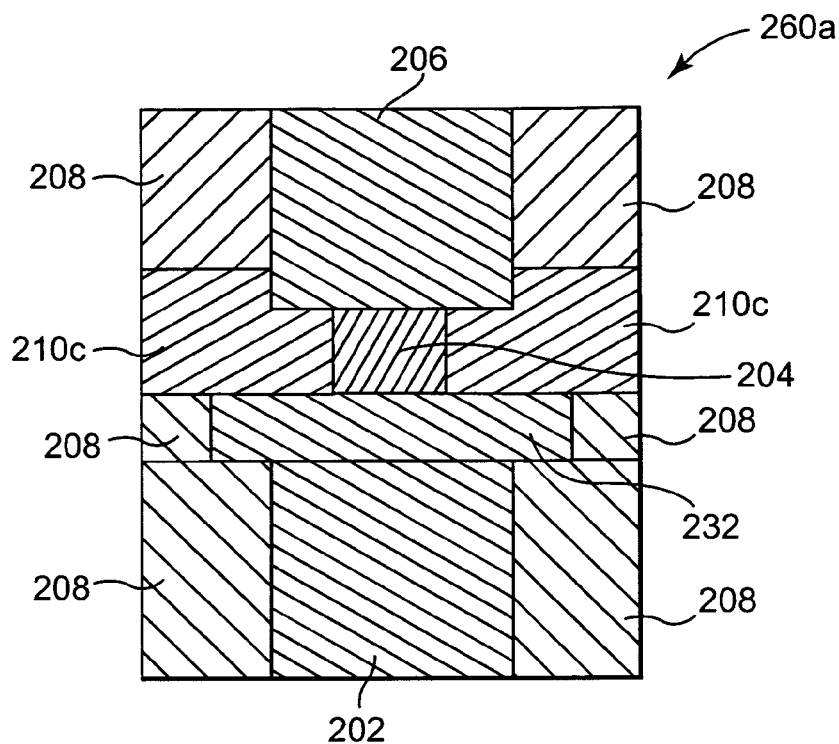
FIG. 31A illustrates a cross-sectional view of another embodiment of a phase change memory cell.

FIG. 31A illustrates a cross-sectional view of another embodiment of a phase change memory cell 260a. Phase change memory cell 260a is similar to phase change memory cell 250a previously described and illustrated with reference to FIG. 29A, except that phase change memory cell 260a includes bottom contact 232 as previously described with reference to phase change memory cell 230a illustrated in FIG. 13A. In one embodiment, each of the memory cells 106a-106d is similar to phase change memory cell 260a. Phase change memory cell 260a operates similarly to phase change memory cell 200a.

Figure 31B:
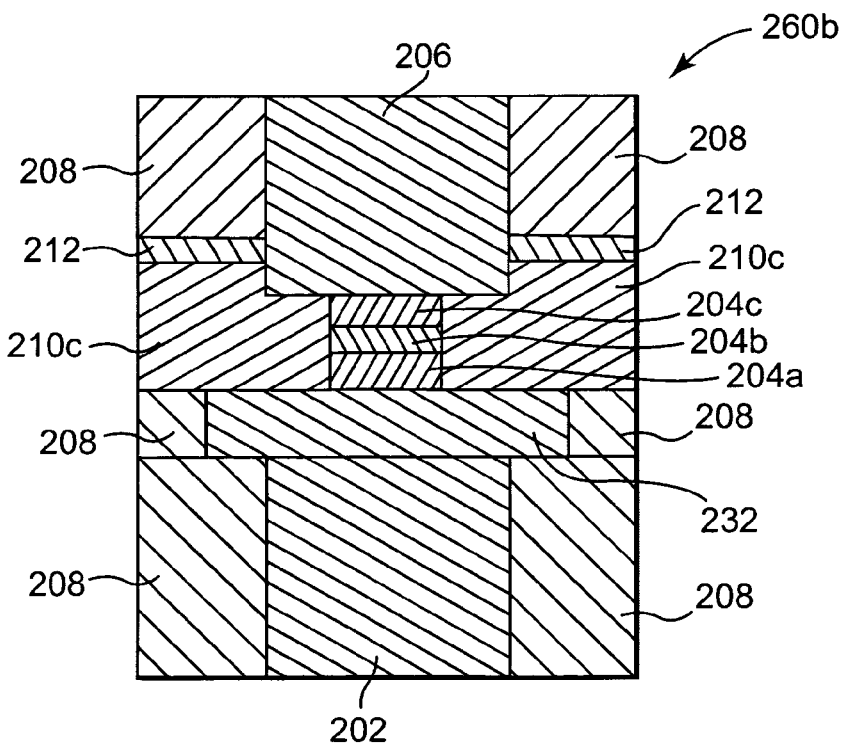
FIG. 31B illustrates a cross-sectional view of another embodiment of a phase change memory cell.

FIG. 31B illustrates a cross-sectional view of another embodiment of a phase change memory cell 260b. Phase change memory cell 260b is similar to phase change memory cell 260a previously described and illustrated with reference to FIG. 31A, except that phase change memory cell 260b includes etch stop material layer 212 and phase change material layer stack 204a-204c as previously described with reference to phase change memory cell 200b illustrated in FIG. 2B. In one embodiment, each of the memory cells 106a-106d is similar to phase change memory cell 260b. Phase change memory cell 260b operates similarly to phase change memory cell 200a.

Phase change memory cell 260a and phase change memory cell 260b are fabricated using the processes previously described and illustrated with reference to FIGS. 14-19 (fabricating bottom contact 232), FIG. 30 (fabricating storage location 204 and dielectric material layer 210c), and FIGS. 9A-10 (fabricating second electrode 206).

Figure 32A:
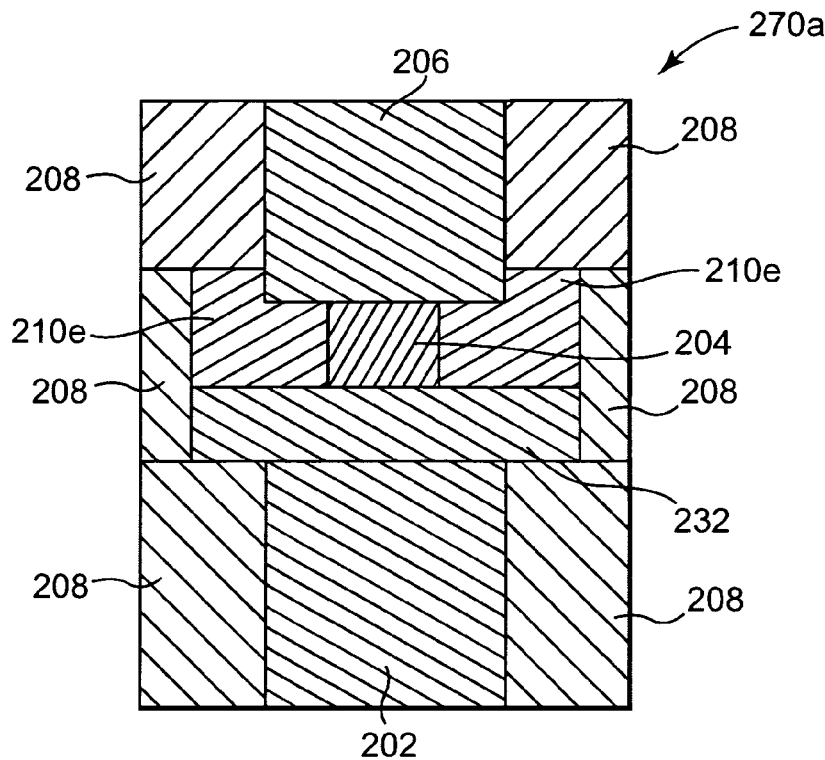
FIG. 32A illustrates a cross-sectional view of another embodiment of a phase change memory cell.

FIG. 32A illustrates a cross-sectional view of another embodiment of a phase change memory cell 270a. Phase change memory cell 270a is similar to phase change memory cell 230a previously described and illustrated with reference to FIG. 13A, except that in phase change memory cell 270a dielectric material layer 210a is replaced with dielectric material layer 210e. Dielectric material layer 210e surrounds phase change material 204 and surrounds the bottom portion of second electrode 206. Dielectric material layer 210e is laterally surrounded by insulation material 208. In one embodiment, each of the memory cells 106a-106d is similar to phase change memory cell 270a. Phase change memory cell 270a operates similarly to phase change memory cell 200a.

Figure 32B:
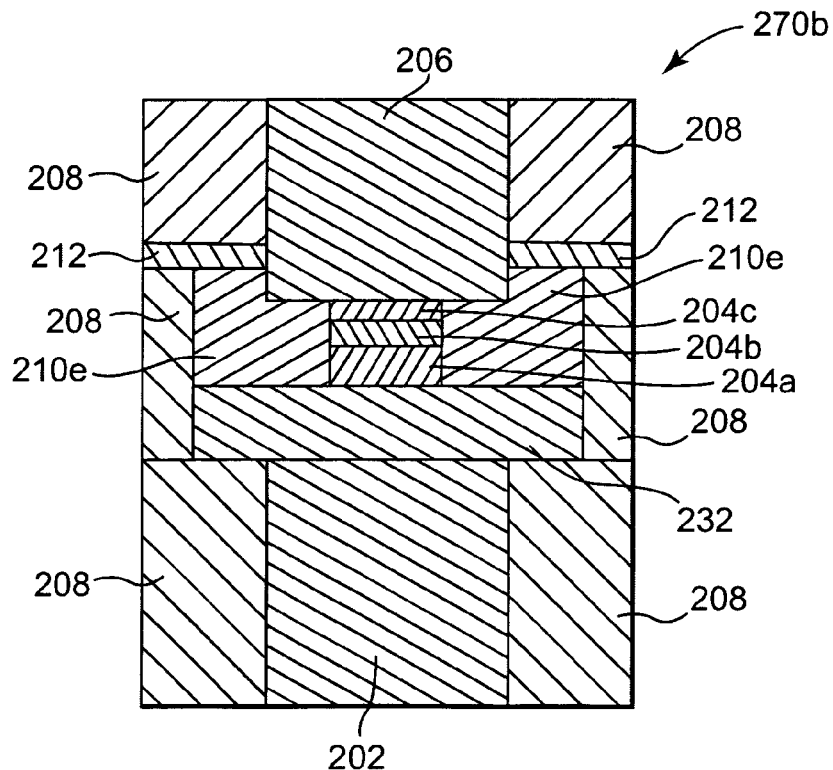
FIG. 32B illustrates a cross-sectional view of another embodiment of a phase change memory cell.

FIG. 32B illustrates a cross-sectional view of another embodiment of a phase change memory cell 270b. Phase change memory cell 270b is similar to phase change memory cell 270a previously described and illustrated with reference to FIG. 32A, except that phase change memory cell 270b includes etch stop material layer 212 and phase change material layer stack 204a-204c as previously described with reference to phase change memory cell 200b illustrated in FIG. 2B. In one embodiment, each of the memory cells 106a-106d is similar to phase change memory cell 270b. Phase change memory cell 270b operates similarly to phase change memory cell 200a.

Figure 33:
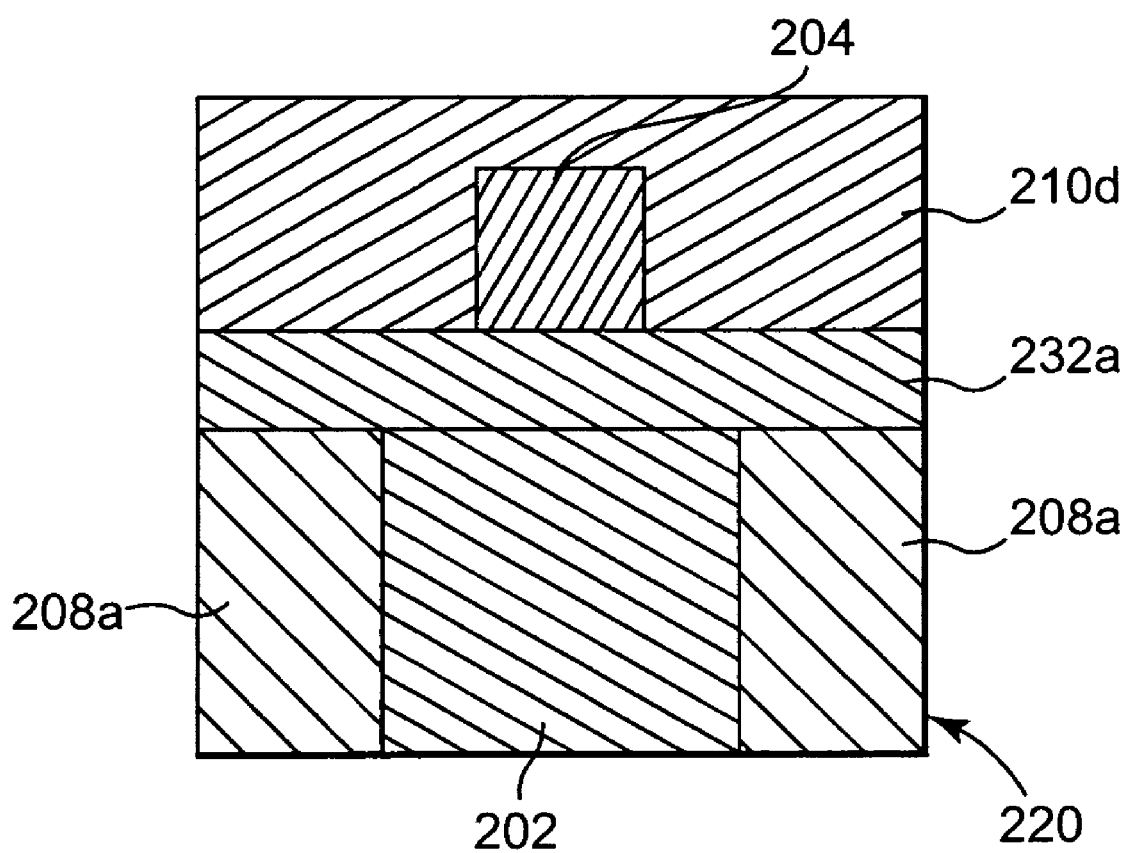
FIG. 33 illustrates a cross-sectional view of one embodiment of the preprocessed wafer, the contact material layer, the storage location, and a dielectric material layer.

The following FIG. 33 illustrates embodiments of a method for fabricating a phase change memory cell, such as phase change memory cell 270a previously described and illustrated with reference to FIG. 32A and phase change memory cell 270b previously described and illustrated with reference to FIG. 32B. The fabrication process begins by performing the steps previously described and illustrated with reference to FIGS. 21-25.

FIG. 33 illustrates a cross-sectional view of one embodiment of preprocessed wafer 220, contact material layer 232a, storage location 204, and a dielectric material layer 210d. Dielectric material, such as $SiO_2$, $SiO_x$, SiN, FSG, BPSG, BSG, low-k material, or other suitable dielectric material is deposited over exposed portions of contact material layer 232a and storage location 204. The dielectric material is deposited using CVD, ALD, MOCVD, PVD, JVP, or other suitable deposition technique. The dielectric material is planarized using CMP or another suitable planarization technique without exposing storage location 204 to provide dielectric material layer 210d.

Storage location 204 is protected from the planarization by the portion of dielectric material layer 210d capping storage location 204. In one embodiment, dielectric material 210d and insulation material 208a include the same material. In another embodiment, dielectric material 210d has a lower thermal conductivity than insulation material 208a. The process previously described with reference to FIGS. 27-28 (etching dielectric material layer 210d and contact material layer 232a) and FIGS. 9A-10 (fabricating second electrode 206) is then performed, except that dielectric material layer 210d is also etched to provide opening 224 illustrated in FIG. 10. This process is used to fabricate phase change memory cell 270a as illustrated in FIG. 32A or phase change memory cell 270b as illustrated in FIG. 32B.

Figure 34A:
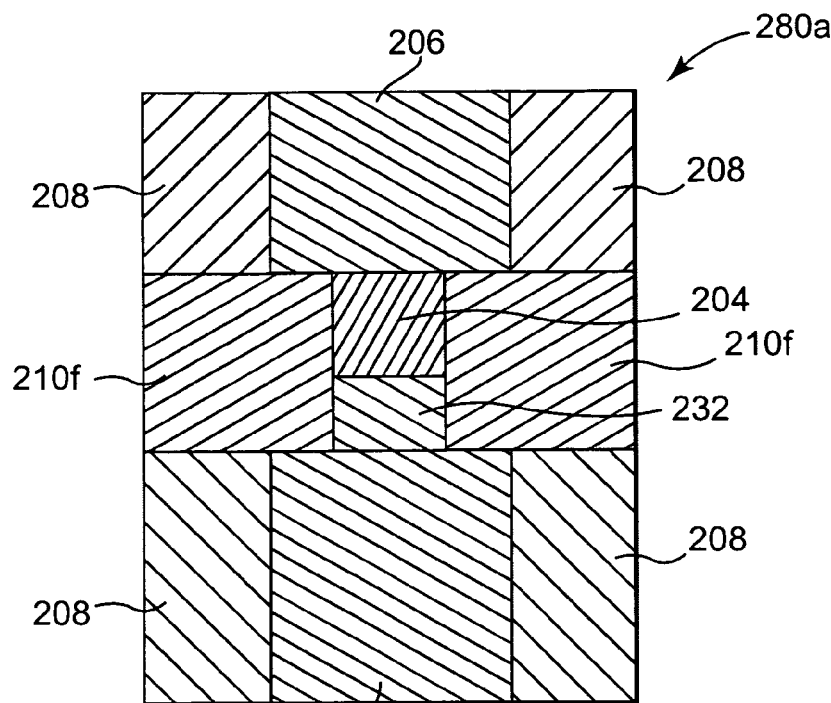
FIG. 34A illustrates a cross-sectional view of another embodiment of a phase change memory cell.

FIG. 34A illustrates a cross-sectional view of another embodiment of a phase change memory cell 280a. Phase change memory cell 280a is similar to phase change memory cell 230a previously described and illustrated with reference to FIG. 13A, except that in phase change memory cell 280a bottom contact 232 has the same cross-sectional width as phase change material 204 and both phase change material 204 and bottom contact 232 are laterally surrounded by dielectric material layer 210f. In one embodiment, each of the memory cells 106a-106d is similar to phase change memory cell 280a. Phase change memory cell 280a operates similarly to phase change memory cell 200a.

Figure 34B:
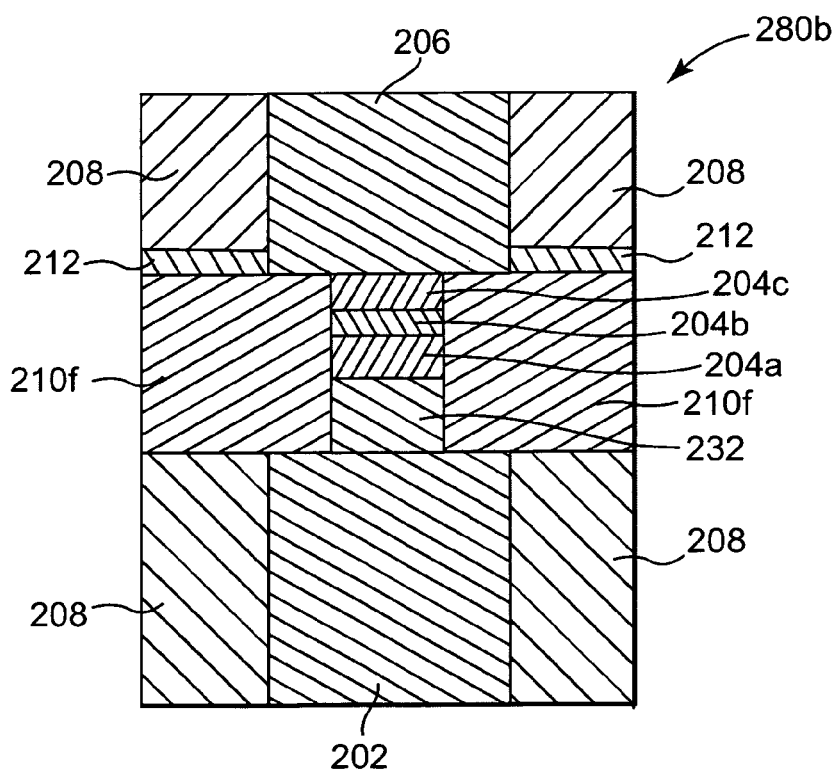
FIG. 34B illustrates a cross-sectional view of another embodiment of a phase change memory cell.

FIG. 34B illustrates a cross-sectional view of another embodiment of a phase change memory cell 280b. Phase change memory cell 280b is similar to phase change memory cell 280a previously described and illustrated with reference to FIG. 34A, except that phase change memory cell 280b includes etch stop material layer 212 and phase change material layer stack 204a-204c as previously described with reference to phase change memory cell 200b illustrated in FIG. 2B. In one embodiment, each of the memory cells 106a-106d is similar to phase change memory cell 280b. Phase change memory cell 280b operates similarly to phase change memory cell 200a.

Figure 35:
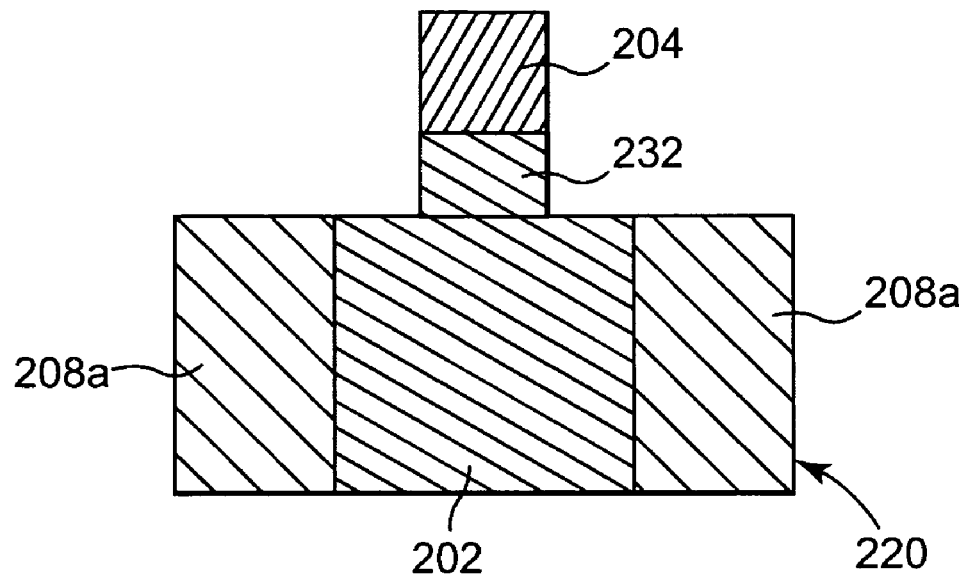
FIG. 35 illustrates a cross-sectional view of one embodiment of the preprocessed wafer, a bottom contact, and a storage location after etching the phase change material layer and the contact material layer.

The following FIG. 35 illustrates embodiments of a method for fabricating a phase change memory cell, such as phase change memory cell 280a previously described and illustrated with reference to FIG. 34A and phase change memory cell 280b previously described and illustrated with reference to FIG. 34B. The fabrication process begins by performing the steps previously described and illustrated with reference to FIGS. 21-24.

FIG. 35 illustrates a cross-sectional view of one embodiment of preprocessed wafer 220, a bottom contact 232, and a storage location 204 after etching phase change material layer 203 and contact material layer 232a. The portions of phase change material layer 203 and contact material layer 232a not protected by resist mask layer 222b are etched to expose preprocessed wafer 220 and provide phase change material storage location 204 and bottom contact 232. Resist mask layer 222b is then removed.

Figure 36:
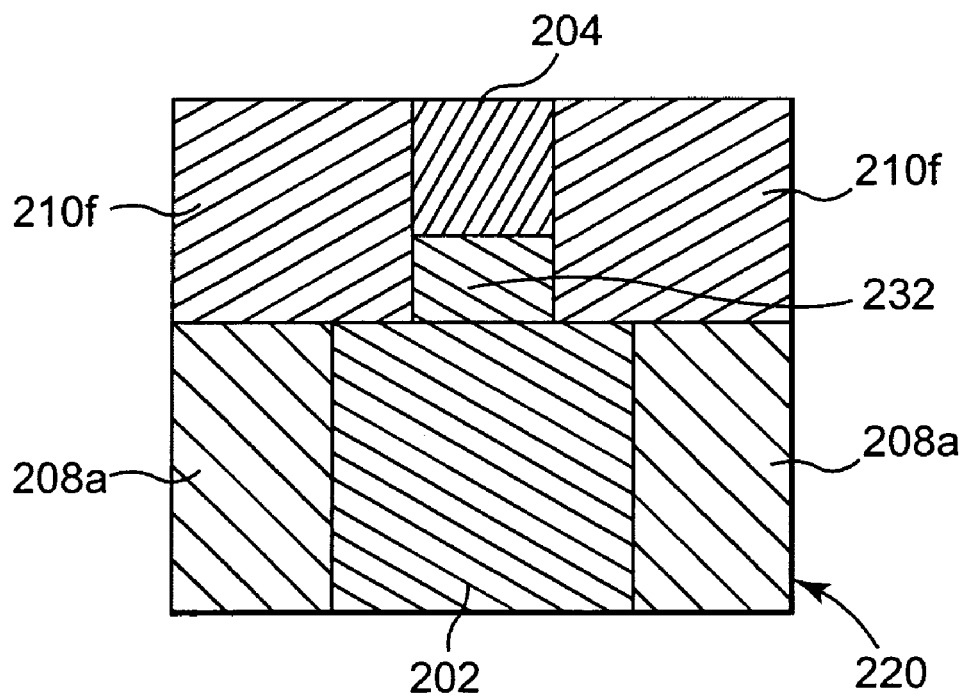
FIG. 36 illustrates a cross-sectional view of one embodiment of the preprocessed wafer, the bottom contact, the storage location, and a dielectric material layer.

FIG. 36 illustrates a cross-sectional view of one embodiment of preprocessed wafer 220, bottom contact 232, storage location 204, and a dielectric material layer 210f. Dielectric material, such as $SiO_2$, $SiO_x$, SiN, FSG, BPSG, BSG, low-k material, or other suitable dielectric material is deposited over exposed portions of preprocessed wafer 220, bottom contact 232, and storage location 204. The dielectric material is deposited using CVD, ALD, MOCVD, PVD, JVP, or other suitable deposition technique. The dielectric material is planarized using CMP or another suitable planarization technique to expose storage location 204 and provide dielectric material layer 210f. In one embodiment, dielectric material layer 210f and insulation material 208a include the same material. In another embodiment, dielectric material layer 210f has a lower thermal conductivity than insulation material 208a. The process previously described with reference to FIGS. 9A-12 is then performed to fabricate second electrode 206 of phase change memory cell 280a as illustrated in FIG. 34A or phase change memory cell 280b as illustrated in FIG. 34B.

Embodiments of the present invention provide a fabrication process for fabricating pillar type phase change memory cells. The phase change material storage location for each memory cell is fabricated using a first deposition, patterning, and etching process. After the phase change material storage location is formed, the second electrode contacting the storage location is fabricated using a second deposition, patterning, and etching process. In this way, the structural integrity of the memory cell is maintained during the fabrication process.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory cell comprising:
   a first electrode;
   a storage location comprising phase change material and contacting the first electrode, the storage location having a first cross-sectional width;
   a second electrode having a surface contacting the storage location, the second electrode having a second cross-sectional width greater than the first cross-sectional width;
   an insulation material laterally surrounding a first portion of the second electrode; and
   an etch stop material layer laterally surrounding a second portion of the second electrode and not directly contacting the storage location, the etch stop material different than the insulation material and the etch stop material layer having a surface coplanar with the surface of the second electrode,
   wherein the first electrode, the storage location, and the second electrode form a pillar phase change memory cell.

2. The memory cell of claim 1, wherein the storage location comprises a stack of phase change material layers.

3. The memory cell of claim 2, further comprising:
   a diffusion barrier layer between adjacent phase change material layers.

4. The memory cell of claim 1, wherein the phase change material comprises at least one of Ge, Sb, Te, Ga, As, In, Se, and S.

5. The memory cell of claim 1, further comprising:
   a dielectric material laterally surrounding the storage location, the dielectric material different than the insulation material and the etch stop material.

6. The memory cell of claim 1, further comprising:
   a diffusion barrier layer between the storage location and the first electrode.

7. The memory cell of claim 1, further comprising:
   a diffusion barrier layer between the storage location and the second electrode.

8. The memory cell of claim 1, wherein the storage location has a sublithographic cross-sectional width.

9. A memory cell comprising:
   a first electrode;
   a storage location comprising a stack of at least two planar phase change material layers, at least two of the phase change material layers in the stack comprising different phase change materials, the storage location coupled to the first electrode and having a first cross-sectional width;
   a second electrode coupled to the storage location, the second electrode having a second cross-sectional width greater than the first cross-sectional width;
   an insulation material laterally surrounding a first portion of the second electrode; and
   an etch stop material layer laterally surrounding a second portion of the second electrode, the etch stop material different than the insulation material;
   wherein the first electrode, the storage location, and the second electrode form a pillar phase change memory cell, and
   wherein a bottom surface of the etch stop material layer is coplanar with a bottom surface of the second electrode.

10. The memory cell of claim 9, wherein the storage location comprises three phase change material layers and adjacent phase change material layers comprises different phase change materials.

11. The memory cell of claim 9, wherein the phase change materials comprises at least one of Ge, Sb, Te, Ga, As, In, Se, and S.

12. The memory cell of claim 9, further comprising:
an insulation material laterally surrounding the second electrode; and
dielectric material laterally surrounding the storage location, the dielectric material different than the insulation material.

13. The memory cell of claim 9, wherein the storage location has a sublithographic cross-sectional width.

14. The memory cell of claim 9, wherein the storage location directly contacts the first electrode.

15. The memory cell of claim 9, wherein the storage location directly contacts the second electrode.

16. The memory cell of claim 9, wherein the storage location directly contacts the first electrode and the second electrode.

17. A memory cell comprising:
a first electrode;
a storage location comprising a stack of at least two phase change material layers, at least two of the phase change material layers in the stack comprising different phase change materials, the storage location coupled to the first electrode and having a first cross-sectional width;
a second electrode coupled to the storage location, the second electrode having a second cross-sectional width greater than the first cross-sectional width;
an insulation material laterally surrounding a first portion of the second electrode; and
an etch stop material layer laterally surrounding a second portion of the second electrode, the etch stop material different than the insulation material;
wherein the first electrode, the storage location, and the second electrode form a pillar phase change memory cell, and
wherein a bottom surface of the etch stop material layer is coplanar with a bottom surface of the second electrode.

18. The memory cell of claim 17, wherein the storage location comprises three phase change material layers and adjacent phase change material layers comprises different phase change materials.

19. The memory cell of claim 17, wherein the phase change materials comprises at least one of Ge, Sb, Te, Ga, As, In, Se, and S.

20. The memory cell of claim 17, further comprising:
an insulation material laterally surrounding the second electrode; and
dielectric material laterally surrounding the storage location, the dielectric material different than the insulation material.

21. The memory cell of claim 17, wherein the storage location has a sublithographic cross-sectional width.

22. The memory cell of claim 17, wherein the storage location directly contacts the first electrode.

23. The memory cell of claim 17, wherein the storage location directly contacts the second electrode.

24. The memory cell of claim 17, wherein the storage location directly contacts the first electrode and the second electrode.

* * * * *